(12) United States Patent
Rupp et al.

(10) Patent No.: US 11,063,144 B2
(45) Date of Patent: Jul. 13, 2021

(54) SILICON CARBIDE SEMICONDUCTOR COMPONENT

(71) Applicant: Infineon Technologies AG, Neubiberg (DE)

(72) Inventors: Roland Rupp, Lauf (DE); Larissa Wehrhahn-Kilian, Erlangen (DE); Bernd Zippelius, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 4 days.

(21) Appl. No.: 16/361,696

(22) Filed: Mar. 22, 2019

(65) Prior Publication Data

US 2019/0296141 A1 Sep. 26, 2019

(30) Foreign Application Priority Data

Mar. 23, 2018 (DE) .......................... 102018106967.7

(51) Int. Cl.
| | | |
|---|---|---|
| *H01L 29/78* | (2006.01) | |
| *H01L 29/16* | (2006.01) | |
| *H01L 29/06* | (2006.01) | |
| *H01L 29/417* | (2006.01) | |
| *H01L 29/32* | (2006.01) | |
| *H01L 29/872* | (2006.01) | |

(Continued)

(52) U.S. Cl.
CPC ...... *H01L 29/7802* (2013.01); *H01L 29/0619* (2013.01); *H01L 29/1608* (2013.01); *H01L 29/32* (2013.01); *H01L 29/41741* (2013.01); *H01L 29/861* (2013.01); *H01L 29/872* (2013.01); *H01L 29/045* (2013.01)

(58) Field of Classification Search
CPC ............. H01L 29/0603; H01L 29/0642; H01L 29/0649; H01L 29/66666; H01L 29/66712; H01L 29/7827; H01L 29/7802; H01L 29/0619; H01L 29/1608; H01L 29/32; H01L 29/41741; H01L 29/761; H01L 29/872; H01L 29/045
USPC ...................................................... 257/913
See application file for complete search history.

(56) References Cited

U.S. PATENT DOCUMENTS

| | | | | |
|---|---|---|---|---|
| 2,937,114 A | * | 5/1960 | Shockley ............ | H01L 21/2252 257/653 |
| 3,312,881 A | * | 4/1967 | Yu ......................... | H01L 29/00 257/593 |

(Continued)

FOREIGN PATENT DOCUMENTS

| | | | | | |
|---|---|---|---|---|---|
| JP | 2014-90057 | | * | 5/2014 | ............. H01L 29/78 |
| JP | 2014-90057 A | | * | 5/2014 | ............. H01L 29/78 |
| JP | 2016082197 A | | | 5/2016 | |

OTHER PUBLICATIONS

Machine translation, Sugahara, Japanese Pat. Pub. No. 2014-90057, translation date: Aug. 14, 2020, Espacenet, all pages. (Year: 2020).*

(Continued)

*Primary Examiner* — Victoria K. Hall
(74) *Attorney, Agent, or Firm* — Murphy, Bilak & Homiller, PLLC

(57) ABSTRACT

A semiconductor component includes a SiC semiconductor body. A drift zone of a first conductivity type and a semiconductor region are formed in the SiC semiconductor body. Barrier structures extending from the semiconductor region into the drift zone differ from the gate structures.

12 Claims, 12 Drawing Sheets

(51) Int. Cl.
  *H01L 29/861* (2006.01)
  *H01L 29/04* (2006.01)

(56) References Cited

U.S. PATENT DOCUMENTS

| | | | | |
|---|---|---|---|---|
| 5,698,891 A * | 12/1997 | Tomita | ................ | H01L 21/3221 |
| | | | | 257/610 |
| 5,757,063 A * | 5/1998 | Tomita | ................ | H01L 21/3221 |
| | | | | 257/610 |
| 5,807,783 A * | 9/1998 | Gaul | ................ | H01L 21/76264 |
| | | | | 257/E21.564 |
| 7,304,356 B2 * | 12/2007 | Takahashi | ........... | H01L 29/0619 |
| | | | | 257/328 |
| 7,652,326 B2 * | 1/2010 | Kocon | ................ | H01L 21/6835 |
| | | | | 257/328 |
| 7,875,958 B2 * | 1/2011 | Cheng | ................. | H01L 29/882 |
| | | | | 257/617 |
| 8,324,660 B2 * | 12/2012 | Lochtefeld | ............ | H01L 29/778 |
| | | | | 257/190 |
| 8,344,242 B2 * | 1/2013 | Fiorenza | ............. | H01L 31/1852 |
| | | | | 136/255 |
| 8,502,263 B2 * | 8/2013 | Li | ....................... | H01L 21/0262 |
| | | | | 257/103 |
| 9,508,890 B2 * | 11/2016 | Li | ....................... | H01L 31/1852 |
| 10,461,181 B2 * | 10/2019 | Kim | .................... | H01L 29/0615 |
| 2002/0185705 A1 * | 12/2002 | Saitoh | ................ | H01L 29/7811 |
| | | | | 257/492 |
| 2003/0141547 A1 * | 7/2003 | Yamashita | ........ | H01L 21/76264 |
| | | | | 257/350 |
| 2005/0167742 A1 * | 8/2005 | Challa | ............... | H01L 29/66734 |
| | | | | 257/328 |
| 2006/0006458 A1 * | 1/2006 | Motai | ................ | H01L 29/7802 |
| | | | | 257/330 |
| 2007/0108512 A1 * | 5/2007 | Sedlmaier | ........... | H01L 29/0661 |
| | | | | 257/328 |
| 2007/0108513 A1 * | 5/2007 | Rub | .................... | H01L 29/7804 |
| | | | | 257/329 |
| 2008/0277765 A1 * | 11/2008 | Lane | ................... | H01L 23/5329 |
| | | | | 257/622 |
| 2009/0079002 A1 * | 3/2009 | Lee | ................... | H01L 29/66712 |
| | | | | 257/355 |
| 2010/0059818 A1 * | 3/2010 | Sasaki | ................ | H01L 29/0634 |
| | | | | 257/339 |
| 2010/0140697 A1 * | 6/2010 | Yedinak | .............. | H01L 29/7811 |
| | | | | 257/334 |
| 2010/0282949 A1 * | 11/2010 | Caporaso | ................ | H01L 31/16 |
| | | | | 250/214 SW |
| 2013/0161689 A1 * | 6/2013 | Huo | ....................... | H01L 21/265 |
| | | | | 257/141 |
| 2013/0181285 A1 * | 7/2013 | Ng | ...................... | H01L 29/0649 |
| | | | | 257/335 |
| 2013/0207187 A1 * | 8/2013 | Huo | .................. | H01L 21/26533 |
| | | | | 257/343 |
| 2014/0048847 A1 * | 2/2014 | Yamashita | .............. | H01L 29/36 |
| | | | | 257/140 |
| 2015/0021670 A1 * | 1/2015 | Schulze | .............. | H01L 29/7811 |
| | | | | 257/288 |
| 2015/0041893 A1 * | 2/2015 | Wang | .................. | H01L 29/7835 |
| | | | | 257/339 |
| 2015/0179792 A1 * | 6/2015 | Sridhar | ............. | H01L 29/66659 |
| | | | | 257/336 |
| 2015/0364598 A1 * | 12/2015 | Jung | .................... | H01L 29/7835 |
| | | | | 257/343 |
| 2016/0181408 A1 * | 6/2016 | Aichinger | ........... | H01L 29/4238 |
| | | | | 257/77 |
| 2016/0231600 A1 * | 8/2016 | Harada | .................... | G02F 1/015 |
| 2016/0240644 A1 * | 8/2016 | Muller | ................ | H01L 27/0727 |
| 2017/0005171 A1 * | 1/2017 | Laforet | ............... | H01L 29/0696 |
| 2017/0077299 A1 * | 3/2017 | Shimizu | ................ | H01L 21/049 |
| 2017/0200791 A1 * | 7/2017 | Willmeroth | ............. | H01L 29/41 |
| 2017/0275779 A1 * | 9/2017 | Nishiguchi | ....... | H01L 21/02433 |
| 2018/0151709 A1 * | 5/2018 | Yoshimoto | ........ | H01L 29/66068 |
| 2018/0175138 A1 * | 6/2018 | Ueno | .................... | H01L 21/046 |
| 2018/0277636 A1 * | 9/2018 | Kiyosawa | ......... | H01L 29/66068 |
| 2019/0148497 A1 * | 5/2019 | Danno | ................ | H01L 29/7813 |
| | | | | 257/77 |
| 2019/0288061 A1 * | 9/2019 | Weber | ............... | H01L 21/26586 |
| 2019/0326392 A1 * | 10/2019 | Deng | .................... | H01L 29/868 |
| 2019/0371885 A1 * | 12/2019 | Mori | .................... | H01L 29/417 |
| 2020/0091333 A1 * | 3/2020 | Shimomura | ........ | H01L 29/7395 |
| 2020/0161437 A1 * | 5/2020 | Meiser | ................ | H01L 29/7805 |

OTHER PUBLICATIONS

Translation, Sugahara, Japanese Pat. Pub. No. Jp 2014-90057A, translation date: Oct. 2, 2020, Steven M. Spar, Translations Service Center, U.S. Patent and Trademark Office, all pages. (Year: 2020).*

Hiyoshi, Toru, et al., "Elimination of the Major Deep Levels in n- and p-Type 4H—SiC by Two-Step Thermal Treatment", Applied Physics Express, vol. 2, No. 9, 2009.

Kimoto, T., et al., "Understanding and Reduction of Degradation Phenomena in SiC Power Devices", 2017 IEEE International Reliability Physics Symposium (IRPS), 2017.

Matsuhata, Hirohumi, et al., "Analysis of Dislocation Structures in 4H—SiC by Synchrotron X-Ray Topography", Electrical Engineering in Japan, vol. 197, No. 3, 2016, pp. 3-17.

* cited by examiner

SILICON CARBIDE SEMICONDUCTOR COMPONENT

TECHNICAL FIELD

The present application relates to SiC (silicon carbide) semiconductor components, for example semiconductor switches having a low on resistance and a high dielectric strength, and to semiconductor diodes.

BACKGROUND

Semiconductor components can comprise a comparatively weakly doped drift zone which, in the off-state case, dissipates the electric field that is effective in the semiconductor component. Doping and vertical extent of the drift zone are designed in accordance with the nominal blocking capability of the semiconductor component. The electrical resistance of the drift zone crucially determines the on resistance and thus the static losses of the semiconductor component.

It is generally endeavored to improve avalanche robustness, breakdown strength and on resistance of SiC semiconductor components.

SUMMARY

One exemplary embodiment of the present disclosure relates to a semiconductor component comprising a SiC semiconductor body, in which a drift zone of a first conductivity type and a semiconductor region are formed. The semiconductor component comprises gate structures and barrier structures, wherein the barrier structures extend from semiconductor region into the drift zone. The barrier structures differ from the gate structures.

A further exemplary embodiment of the present disclosure relates to a semiconductor diode comprising a SiC semiconductor body. A drift zone of a first conductivity type and a semiconductor region are formed in the SiC semiconductor body. Barrier structures extend from the semiconductor region into the drift zone.

Further features and advantages of the semiconductor component described here will become apparent to the person skilled in the art from the exemplary embodiments described in detail below, the figures and the patent claims.

BRIEF DESCRIPTION OF THE DRAWINGS

The accompanying drawings convey a deeper understanding of exemplary embodiments for a silicon carbide semiconductor component, are included in the disclosure and form a part thereof. The drawings merely illustrate exemplary embodiments and together with the description serve to elucidate same. Consequently, the silicon carbide semiconductor component described here is not restricted to the exemplary embodiments by the description thereof. Further exemplary embodiments and numerous advantages from among those intended are evident from the understanding of the following detailed description and from combinations of the following exemplary embodiments described below, even if they are not explicitly described. The elements and structures shown in the drawings are not necessarily illustrated in a manner true to scale with respect to one another. Identical reference signs refer to identical or mutually corresponding elements and structures.

DETAILED DESCRIPTION

Figure 1A:
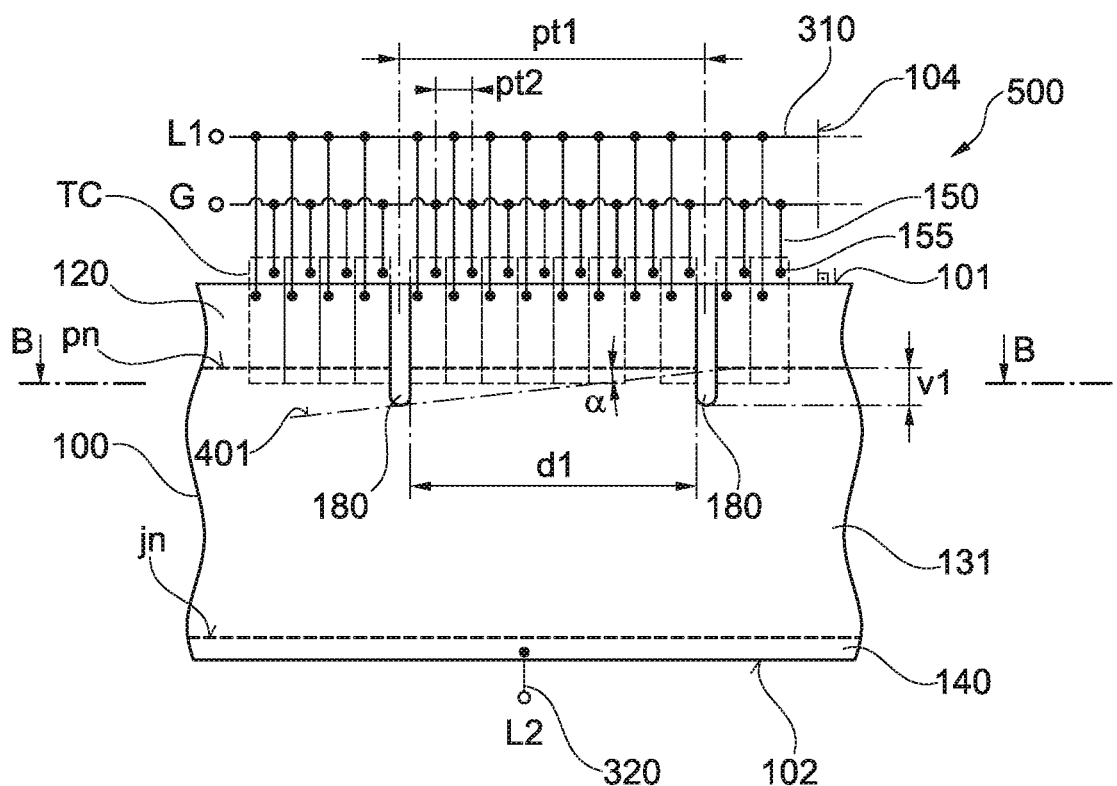
FIG. 1A-1B show a vertical and a horizontal cross section through a semiconductor component in accordance with one embodiment in which barrier structures and gate structures are formed on the same side of a SiC semiconductor body.

In the following detailed description, reference is made to the accompanying drawings, which form part of the disclosure and show specific exemplary embodiments of a semiconductor component for illustration purposes. It goes without saying that further exemplary embodiments exist. It likewise goes without saying that structural and/or logical changes can be made to the exemplary embodiments, without in so doing departing from what is defined by the patent claims. The description of the exemplary embodiments is non-limiting in this respect. In particular, features of exemplary embodiments described below can be combined with features of others of the exemplary embodiments described, provided that nothing to the contrary is evident from the context.

The terms "have", "contain", "encompass", "comprise" and the like hereinafter are open terms which on the one hand indicate the presence of the stated elements or features, and on the other hand do not exclude the presence of further elements or features. The indefinite articles and the definite articles encompass both the plural and the singular, unless something to the contrary is clearly evident from the context.

The term or expression "electrically connected" describes a low-impedance connection between the electrically connected elements, for example a direct contact between the relevant elements or a connection via a metal and/or a highly doped semiconductor. The expression "electrically coupled" includes the fact that one or more intervening elements suitable for transmitting signals or energy can be present between the "electrically coupled" elements, e.g. elements that are controllable such that they can alternately establish a low-impedance connection in a first state and a high-impedance decoupling in a second state.

Some figures represent relative dopant concentrations by the indication "−" or "+" next to the doping type. By way of example, the designation "n−" denotes a dopant concentration which is less than the dopant concentration of an "n"-doped semiconductor area, while an "n+"-doped semiconductor area has a higher dopant concentration than an "n"-doped semiconductor area. The indication of the relative dopant concentration does not mean that doped semiconductor areas with the same relative dopant concentration indication must have the same absolute dopant concentration, unless stated otherwise. Accordingly, two different "n"-doped semiconductor areas can have the same or different absolute dopant concentrations.

If a value range with the indication of one limit value or two limit values is defined for a physical variable, then the prepositions "from" and "to" and the quantifiers "less" and "more" include the respective limit value. An indication of the type "from . . . to" is accordingly understood as "from at least . . . to at most". Correspondingly, an indication of the type "less . . . " ("more . . . ") is understood as "at most . . . " ("at least . . . ").

Main constituents of a layer or structure composed of a chemical compound are formed by the elements whose atoms enter into the chemical compound. By way of example, silicon and carbon are the main constituents of a silicon carbide crystal.

Exemplary embodiments of the present disclosure relate to a semiconductor component. The semiconductor component comprises a SiC semiconductor body, in which a drift zone of a first conductivity type and a semiconductor region are formed. The semiconductor component comprises gate structures and barrier structures, wherein the barrier structures extend from the semiconductor region into the drift zone.

In the off-state case, the drift zone dissipates the majority of the electric field that is effective in the semiconductor body. Doping and vertical extent of the drift zone are designed in accordance with the nominal blocking capability of the semiconductor component.

The gate structures can each comprise at least one electrically conductive gate electrode insulated from the SiC semiconductor body and a gate dielectric between the gate electrode and at least one body region of a transistor cell. An electrical potential of the gate electrode controls the formation of an inversion channel in the body region of the transistor cell.

The semiconductor region can be one doped region formed in a contiguous fashion or can comprise a plurality of doped regions, which can be spatially separated from one another. By way of example, the semiconductor region can comprise a doped region of a second conductivity type, complementary to the first conductivity type, wherein the doped region of the second conductivity type can be a contiguous region or can comprise a plurality of partial regions that are spatially separated from one another. As an alternative or in addition to the doped region of the second conductivity type, the semiconductor region can comprise a doped region of the first conductivity type, wherein the doped region of the first conductivity type can be one contiguous region or can comprise a plurality of partial regions that are spatially separated from one another.

The semiconductor region can be arranged at a first surface of the SiC semiconductor body, said first surface having the gate structures. Alternatively, the semiconductor region can be fitted to a second surface of the SiC semiconductor body, said second surface facing away from the first surface. It is possible for the SiC semiconductor body to have a respective semiconductor region both at the first surface and at the second surface, wherein the two semiconductor regions arranged at opposite surfaces can differ in their doping. At least one of the two semiconductor regions can then have barrier structures.

It is possible for the semiconductor component to comprise fewer barrier structures than gate structures. This may be the case if the semiconductor component comprises barrier structures exclusively at the first surface. Alternatively, the semiconductor component can comprise the same number of barrier structures as gate structures. However, it is also possible for the semiconductor component to comprise more barrier structures than gate structures, for example if the barrier structures are arranged both at the first surface and at the second surface.

The semiconductor region can form a junction with the drift zone. The junction can comprise a pn junction and/or a unipolar junction (also called "jn junction" hereinafter). The term pn junction is understood hereinafter to mean an interface along which the dopings of two complementarily doped regions adjoining one another precisely cancel one another out. The term unipolar junction is understood hereinafter to mean a surface which, between two doped regions of the same conductivity type and having different dopant concentrations, connects points at which a change of dopant concentration has a maximum.

The barrier structures differ structurally from the gate structures. In particular, during operation of the semiconductor component within the absolute maximum ratings, the barrier structures do not exercise a controlling effect. The barrier structures do not comprise a conductive structure, for example. Insofar as the barrier structures comprise a conductive structure, the electrical potential thereof cannot be controlled and/or a change in the electrical potential does not lead to the formation of inverse channels during operation within the absolute maximum ratings. The barrier structures are accordingly free of an electrical drive function and/or an electrical control function for the semiconductor component. The barrier structures can comprise conductive structures that are electrically insulated from the gate electrode and from load terminals of the semiconductor component. The barrier structures can comprise conductive structures that are electrically connected to one of the load terminals of the semiconductor component and are electrically insulated from the SiC semiconductor body. However, it is also possible for the barrier structures to be formed exclusively from electrically insulating and/or semiconducting materials.

By way of example, the barrier structures are formed from a material which differs from the material of the drift zone in at least one different feature than the doping type and/or the dopant concentration, such that lattice planes of the SiC semiconductor body, e.g. (0001) lattice planes of a 4H-SiC crystal, do not continue into the barrier structure, but rather end at the barrier structures. The barrier structures can block the propagation of crystal defects along such lattice planes.

The barrier structures can contain silicon and carbon as sole main constituents, and in this case, can have a different crystallization form or a different polytype than the SiC crystal of the drift zone. By way of example, the barrier structures can comprise at least one different main constituent than silicon and carbon and/or the barrier structures can predominantly consist of one or more dielectric materials.

If a bipolar charge carrier flow of holes and electrons flows through the drift zone, then a recombination of holes and electrons can occur to a no longer inconsiderable extent in particular in the vicinity of pn junctions and unipolar junctions. The energy released here promotes the growth of crystallographic defects. By way of example, dislocations between lattice planes (basal plane dislocations, BPDs) can transfer into stacking faults (Shockley stacking faults, SSFs) which continue along lattice planes in silicon carbide. The crystal defects can then grow substantially transversely with respect to the main current flow direction in the drift zone and thus impede a vertical current flow through the drift zone. In this case, the lattice planes can extend at an angle of between 2° and 10° with respect to pn junctions and unipolar junctions of the drift zone.

The barrier structures extending into the drift zone proceeding from pn junctions and/or unipolar junctions terminate the lattice planes of the SiC semiconductor body, e.g. (0001) lattice planes of a 4H-SiC crystal. The growth of the crystal defects ends at the barrier structures and cannot continue through the barrier structures. As a result, the barrier structures form physical barriers to the propagation of crystal defects along such lattice planes. The barrier structures restrict the growth of the crystal defects to a narrow vertical section of the drift zone at the junction with the semiconductor region and thus restrict the maximum extent of the bipolar degradation.

The gate structures can be planar gate structures formed on one of the two surfaces of the SiC semiconductor body, or trench structures extending from a first surface of the SiC semiconductor body into the SiC semiconductor body.

The semiconductor region can comprise a region of a second conductivity type formed between the drift zone and the first surface. In this case, it is possible for the barrier structures to extend from the first surface through the semiconductor region. However, the barrier structures can also be at a distance from the first surface. A first distance between a lower edge of the barrier structure and the first surface can be greater than a second distance between a lower edge of the gate structures and the first surface. The barrier structures accordingly extend deeper into the drift zone than the gate structures, such that the barrier structures can suppress the propagation of lattice defects into the drift zone to a higher extent than the gate structures.

A first distance between a lower edge of the barrier structures and the first surface can be greater than a distance between the first surface and a pn junction which is formed between the first surface and the drift zone and which is at the furthest distance from the first surface, such that the barrier structures can manifest their effect on all pn junctions at the component front side (i.e. the first surface).

A lateral distance between adjacent barrier structures and a vertical extent of the barrier structures in the drift zone can be dimensioned such that at least 90% of the principal lattice planes, for example all of the principal lattice planes, which intersect a junction formed between the drift zone and the semiconductor region between two barrier structures at an angle of less than 10° adjoin one of the barrier structures in the drift zone.

The principal lattice planes of a crystal are lattice planes having high atomic packing density. In a SiC crystal having a hexagonal crystal structure, inter alia the (0001), (11-20) and (1-100) lattice planes form such principal lattice planes. The polytype of the SiC semiconductor body can be 4H, for example, and the principal lattice planes which intersect the junction at an angle of at most 10° can be (0001) lattice planes.

The junction between semiconductor region and drift zone can extend parallel to the first surface and/or to the second surface situated opposite the first surface and can be interrupted e.g. by the barrier structures or other doped regions. Relative to the vertical extent of the drift zone, the recombination rate in the region of the junction has in each case a local maximum value.

With the specific ratio of the lateral distance between adjacent barrier structures to the vertical extent in the drift zone, principal lattice planes which intersect a region having a high recombination rate are cut off by the barrier structures from a main part of the drift zone below the barrier structures, with the result that precisely such principal lattice planes in which the probability of propagating stacking faults is the highest are separated from the main part of the drift zone.

The bulk breakdown strength of the barrier structures can be at least 90% of the bulk breakdown strength of a part of the drift zone that is adjacent to the barrier structures, with the result that the breakdown voltage of the semiconductor component is not influenced, or is only slightly influenced, by the barrier structures.

In accordance with one embodiment, the barrier structures can comprise polycrystalline silicon carbide, amorphous silicon carbide, crystalline silicon carbide of a different crystal type than that of the drift zone, and/or crystalline silicon carbide of a different polytype than that of the drift zone. In terms of thermal behavior the barrier structures are similar to the SiC semiconductor body to an extent such that the barrier structures generate additional thermomechanical stresses only very slightly.

Further exemplary embodiments of the present disclosure relate to a semiconductor diode comprising a SiC semiconductor body. A drift zone of a first conductivity type and a semiconductor region are formed in the SiC semiconductor body. Barrier structures extend from the semiconductor region into the drift zone.

The barrier structures of a semiconductor diode described here can have properties similar or identical to those of the barrier structures of a semiconductor component described here. That is to say that the disclosure in relation to the barrier structures in connection with the exemplary embodiments of the semiconductor component is also analogously applicable to the exemplary embodiments of the semiconductor diode, and vice versa.

In the case of forward-biasing, a bipolar current flows through the drift zone. The recombination of electrons and holes at specific crystal defects can transform linear defects, e.g. BPDs, into aerial defects, e.g. SSFs, which lead to a significant increase in the static losses during forward operation of the diode. The barrier structures form physical barriers which locally interrupt the SiC crystal structure and stop the propagation of crystal defects along the lattice planes.

FIGS. 1A to 1D show semiconductor components 500, which can be for example IGFETs (insulated gate field effect transistors), for example MOSFETs (metal oxide semiconductor FET), wherein the abbreviation MOSFET stands both for FETs having a metallic gate electrode and for FETs having a semiconductor gate electrode. The semiconductor components 500 can also be IGBTs (insulated gate bipolar transistors) or MCDs (MOS-controlled diodes).

The semiconductor components 500 are based in each case on a SiC semiconductor body 100 formed with silicon carbide. By way of example, the SiC semiconductor body 100 comprises a silicon carbide crystal or consists thereof, wherein the silicon carbide crystal can comprise doping atoms and/or impurities, e.g. hydrogen and/or oxygen atoms, besides the main constituents of silicon and carbon. The polytype of the silicon carbide crystal can be for example 4H.

A first surface 101 on a front side of the SiC semiconductor body 100 is planar or ribbed. A normal 104 to a planar first surface 101 or to a central plane of a ribbed first surface 101 defines a vertical direction. Directions parallel to a planar first surface 101 or to the central plane of a ribbed first surface 101 are horizontal and lateral directions.

A drift zone 131 of a first conductivity type and a semiconductor region 120, 140 are formed in the SiC semiconductor body 100. The semiconductor component 500 comprises transistor cells TC having gate structures 150 and barrier structures 180.

The transistor cells TC having the gate structures 150 are formed on the front side of the SiC semiconductor body 100, wherein each transistor cell TC can comprise a respective gate structure 150. The gate structures 150 can be planar gate structures 150 formed on the first surface 101, or trench gate structures extending from the first surface 101 into the SiC semiconductor body 100. The gate structures 150 each comprise at least one conductive gate electrode that is electrically insulated from the SiC semiconductor body 100. The gate electrodes of the transistor cells TC can be connected to a gate terminal G of the semiconductor component 500.

The drift zone 131 is formed in the SiC semiconductor body 100 between the transistor cells TC and the second surface 102. An electric field that is effective in the SiC semiconductor body 100 in the off-state case is predominantly dissipated in the drift zone 131. Doping and vertical extent of the drift zone 131 are designed in accordance with the nominal blocking capability of the semiconductor component 500. The average doping in the drift zone 131 is dependent on the nominal blocking capability and can be in a range of from $2 \times 10^{15}$ cm$^{-3}$ to $5 \times 10^{16}$ cm$^{-3}$ for nominal reverse voltages of between 600 V and 3.3 kV. By way of example, for a SiC semiconductor component having a nominal breakdown voltage of 600V, the doping can be in a range of from $1 \times 10^{16}$ cm$^{-3}$ to $3 \times 10^{16}$ cm$^{-3}$. The vertical extent of the drift zone 131 can be in a range of from 3 μm to 10 μm for a semiconductor component 500 having a nominal breakdown voltage of 600 V and an average doping of approximately $2 \times 10^{16}$ cm$^{-3}$.

The semiconductor region 120, 140 can be one doped region formed in a contiguous fashion or can comprise a plurality of doped regions, which can be spatially separated from one another. By way of example, the semiconductor region can comprise a doped region 120 of a second conductivity type, complementary to the first conductivity type, wherein the doped region 120 of the second conductivity type can be a contiguous region or can comprise a plurality of partial regions that are spatially separated from one another. As an alternative or in addition, the semiconductor region 120, 140 can comprise a doped region 140 of the first conductivity type, wherein the doped region 140 of the first conductivity type can be one contiguous region or can comprise a plurality of partial regions that are spatially separated from one another. The semiconductor region 120, 140 can form a junction pn, jn with the drift zone 131.

The doped region 120 of the second conductivity type can be formed between the first surface 101 and the drift zone 131. By way of example, the doped region 120 of the second conductivity type can comprise body regions of the transistor cells TC, wherein the body regions form transistor pn junctions with source regions which can respectively be formed between a body region and the first surface 101. The body regions and the source regions of the transistor cells TC can be connected to a first load electrode 310 on the component front side. The first load electrode 310 can form a first load terminal L1 of the semiconductor component 500 or can be electrically connected or coupled to the first load terminal L1.

As an alternative or in addition to the body regions, the doped region 120 of the second conductivity type can comprise other doped regions, for example shielding regions, which for example are connected to the electrical potential of the first load terminal L1 and shield partial structures of the transistor cells TC, for example the gate structures 150 or trench contacts extending from the first surface 101 in the SiC semiconductor body 100.

The doped region 140 of the first conductivity type can be formed between the second surface 102 and the drift zone 131 and can directly adjoin the second surface 102 and/or directly adjoin the drift zone 131. The doped region 140 of the first conductivity type can be doped uniformly or comprise two or more partial layers which can differ from one another with regard to the conductivity type and/or the dopant concentration. By way of example, the doped region 140 of the first conductivity type can comprise a highly doped base region along the second surface 102 and one or more doped partial layers of the first conductivity type between the highly doped base region and the drift zone 131, wherein a maximum dopant concentration in the partial layers can be higher than a maximum dopant concentration in the drift zone 131 and can be lower than in the highly doped base region.

The doped region 140 of the first conductivity type can be electrically connected to a second load electrode 320 on the rear side of the SiC semiconductor body 100. The second load electrode 320 can form a second load terminal L2 of the semiconductor component 500 or can be electrically connected or electrically coupled to a second load terminal L2.

Further doped regions of the conductivity type of the drift zone 131 can be formed between the transistor cells TC and the drift zone 131, said further doped regions being more highly doped than the drift zone 131. By way of example, current distribution regions and/or barrier regions can be formed between the transistor cells TC, on the one hand, and the drift zone 131, on the other hand. The current distribution regions, e.g. in the on state, can spread a charge carrier flow for the passage through the drift zone 131 in a lateral direction. The barrier regions can set e.g. the emitter efficiency of doped regions, e.g. of body regions of the transistor cells TC.

The semiconductor region 120, 140 can form a junction pn, jn with the drift zone 131. The junction pn, jn can comprise a pn junction pn and/or a unipolar junction jn. By way of example, the doped region 120 of the second conductivity type can form a pn junction pn with the drift zone 131. The doped region 140 of the first conductivity type can form a unipolar junction jn with the drift zone 131.

Barrier structures 180 extend from the junction pn, jn into the drift zone 131. The barrier structures 180, proceeding from the junction pn, jn, can also continue into the semiconductor region 120, 140.

The barrier structures 180 differ structurally from the gate structures 150. In particular, the barrier structures 180 exercise no controlling effect during operation of the semiconductor component 500 within the absolute maximum ratings. The barrier structures 180 comprise e.g. no conductive structures, or such conductive structures which are electrically isolated from the gate electrode 155. If gate structures 150 project into the drift zone 131, barrier structures 180 on the front side of the SiC semiconductor body 100 have a larger vertical extent in the drift zone 131 than such gate structures 150.

The barrier structures 180 can be arranged at a first center-to-center distance pt1. The gate structures 150 can be arranged at a second center-to-center distance pt2. The first center-to-center distance pt1 can be greater than the second center-to-center distance pt2, for example an integer multiple of the second center-to-center distance pt2. By way of example, the semiconductor component 500 can then comprise fewer barrier structures 180 at the first surface than gate structures 150. The first center-to-center distance pt1 or the second center-to-center distance pt2 and/or the ratio of the first center-to-center distance pt1 to the second center-to-center distance pt2 can vary, for example become larger or smaller toward the lateral center of the SiC semiconductor body 100.

The SiC semiconductor body 100 can be based on a SiC crystal in which a principal lattice plane 401, for example the (0001) lattice plane of a hexagonal crystal, intersects the junction pn, jn at an angle $\alpha$. The angle $\alpha$ can be at least 0°, for example at least 2°, and at most 10°, for example at most 8°.

In the reverse-biased state of the semiconductor component 500, the pn junction pn is forward-biased, such that via the junction pn and the doped region 120 a reverse current can flow between the second load electrode 320 and the first load electrode 310 provided that a voltage drop across the pn junction pn exceeds the threshold voltage of the body diode formed by the pn junction pn.

The reverse current is a bipolar charge carrier flow of holes and electrons. An intensified recombination of holes and electrons can occur in the vicinity of pn junctions and unipolar junctions, that is to say in regions with a high change of dopant concentration. The energy released in the process promotes the growth of crystallographic defects that increasingly damage the SiC crystal. By way of example, dislocations between lattice planes (basal plane dislocations, BPDs) can transfer into stacking faults (Shockley stacking faults, SSFs) which, in silicon carbide of the 4H polytype, continue primarily along (0001) lattice planes and thus transversely with respect to the main current flow direction in the drift zone 131 and increasingly impede the current flow through the drift zone 131.

The recombination density decreases with increasing distance from the junction pn, jn, such that by far the majority of the crystal defects originate at and near the junction pn, jn. The lattice defects propagate predominantly along such principal lattice planes 401 which intersect the junction pn, jn. The barrier structures 180 limit the propagation of the crystal defects into the drift zone 131.

A lateral distance d1 between adjacent barrier structures 180 and a vertical extent v1 of the barrier structures 180 in the drift zone 131 can be dimensioned such that at least 99% or 100% of the principal lattice planes of the SiC semiconductor body 100 which intersect the junction pn, jn formed between the drift zone 131 and the semiconductor region 120 in the region between two barrier structures 180 at an angle $\alpha \leq 10°$, for example in a range of from 2° to 8°, adjoin one of the barrier structures 180 within the drift zone 131.

In accordance with further embodiments, the ratio v1:d1 can be greater than tan $\alpha$, wherein v1 is less than a vertical extent of the drift zone 131. By way of example, the ratio v1:d1 can be at most three times or at most double tan $\alpha$. If the ratio v1:d1 is greater than tan $\alpha$, even crystal defects which occur in such lattice planes which do not intersect the junction pn, jn remain locally limited to a region between two barrier structures 180. The effect of the barrier structures 180 on propagating crystal defects relative to the vertical extent of the barrier structures 180 and thus the efficiency of the barrier structures 180 is high given such a dimensioning.

In accordance with another embodiment, the vertical extent v1 of the barrier structure 180 can be at least 50% of a vertical extent of the drift zone 131 or can be greater than or equal to the vertical extent of the drift zone 131.

The barrier structures 180 can have a longitudinal extent parallel to the lines of intersection between the junction pn, jn and the principal lattice planes 401. The barrier structures 180 can form the regular strip patterns shown in FIGS. 1B and 1D.

Figure 1B:
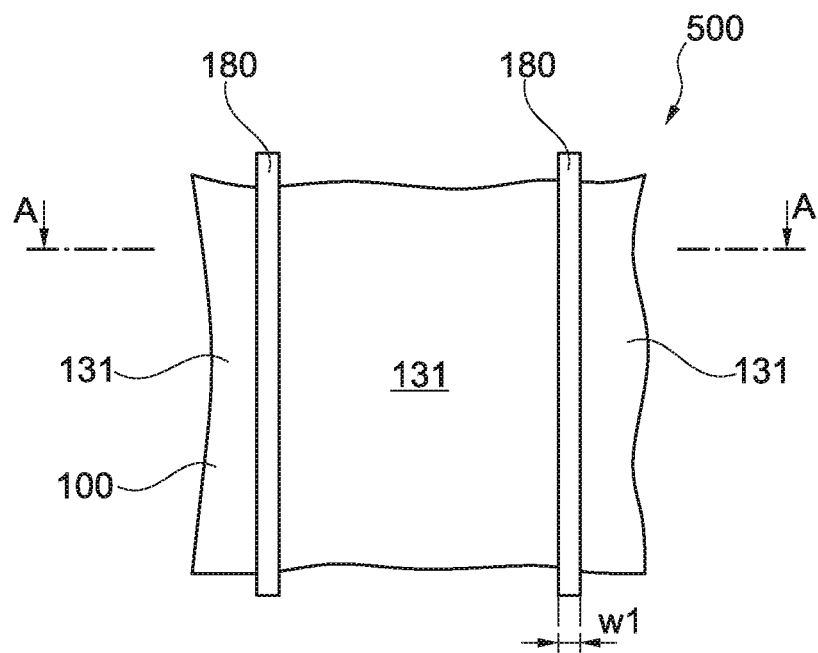

In FIGS. 1A and 1B, the barrier structures 180 are formed at a pn junction pn at the front side of the semiconductor component 500, i.e. on the same side as the gate structures 150. In accordance with the embodiment illustrated, the barrier structures 180 can extend from the first surface 101 continuously into the drift zone 131. In accordance with other embodiments, the barrier structures 180 can be at a distance from the first surface 101. The barrier structures 180 extend deeper into the SiC semiconductor body 100 than the gate structures 150.

A pn junction between the drift zone 131 and the doped region 120 of the second conductivity type, which pn junction is at the furthest distance from the first surface 101, can form the basis taken as a starting point for measuring the vertical extent v1 of the barrier structures 180 in the drift zone 131.

Figure 1C:
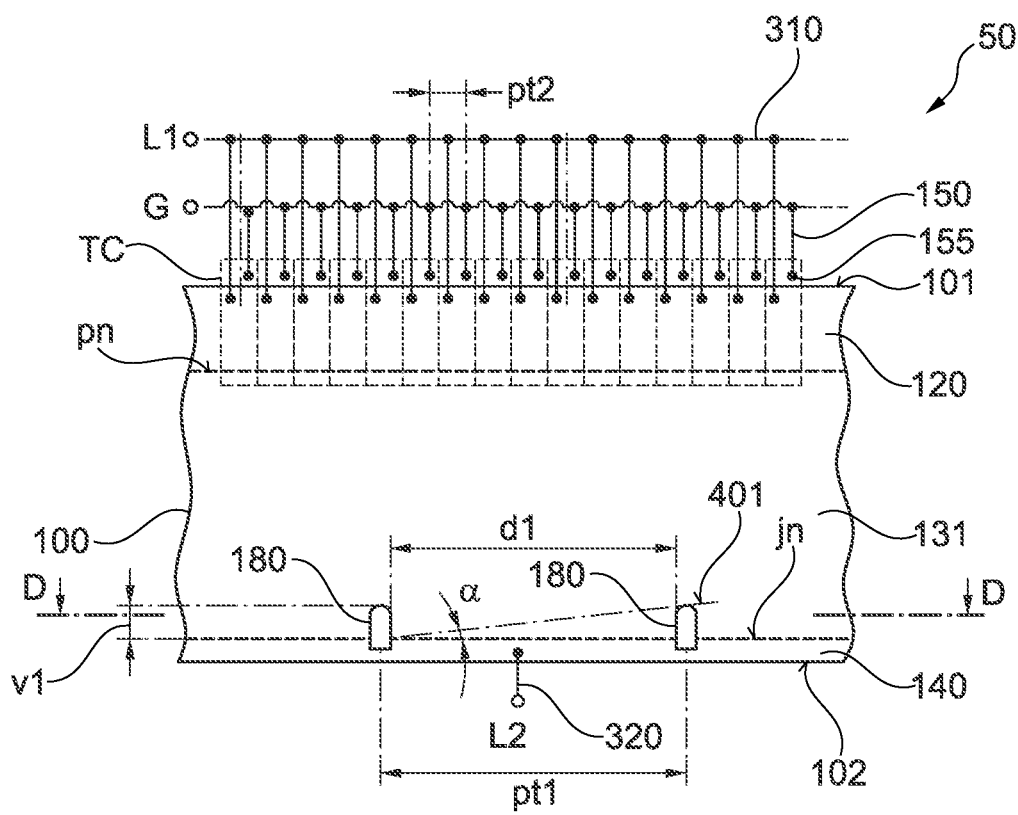
FIGS. 1C-1D show a vertical and a horizontal cross section through a semiconductor component in accordance with one embodiment in which barrier structures and gate structures are formed on mutually opposite sides of a SiC semiconductor body.
Figure 1D:
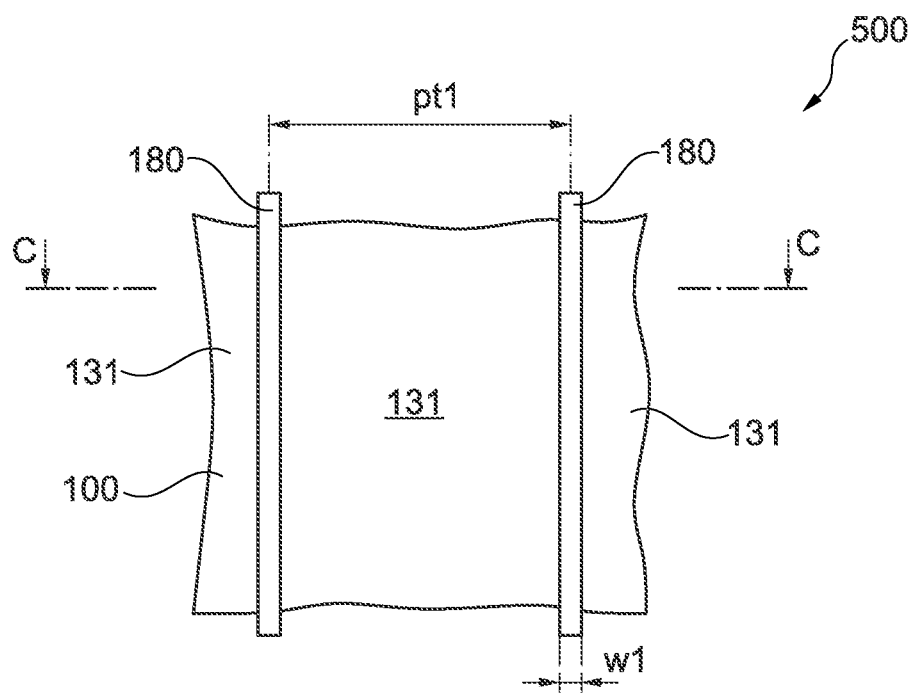

In FIGS. 1C and 1D, the barrier structures 180 are formed at a unipolar junction jn on a rear side of the semiconductor component 500, i.e. on an opposite side of the drift zone 131 relative to the gate structures 150. A junction between the drift zone 131 and the doped region 140 of the first conductivity type, which pn junction is at the furthest distance from the second surface 102, can form the basis taken as a starting point for measuring the vertical extent v1 of the barrier structures 180 in the drift zone 131.

The barrier structures 180 on the component front side in accordance with FIG. 1A and the barrier structures 180 on the component rear side in accordance with FIG. 1C can be formed in the same semiconductor component 500.

Figure 2A:
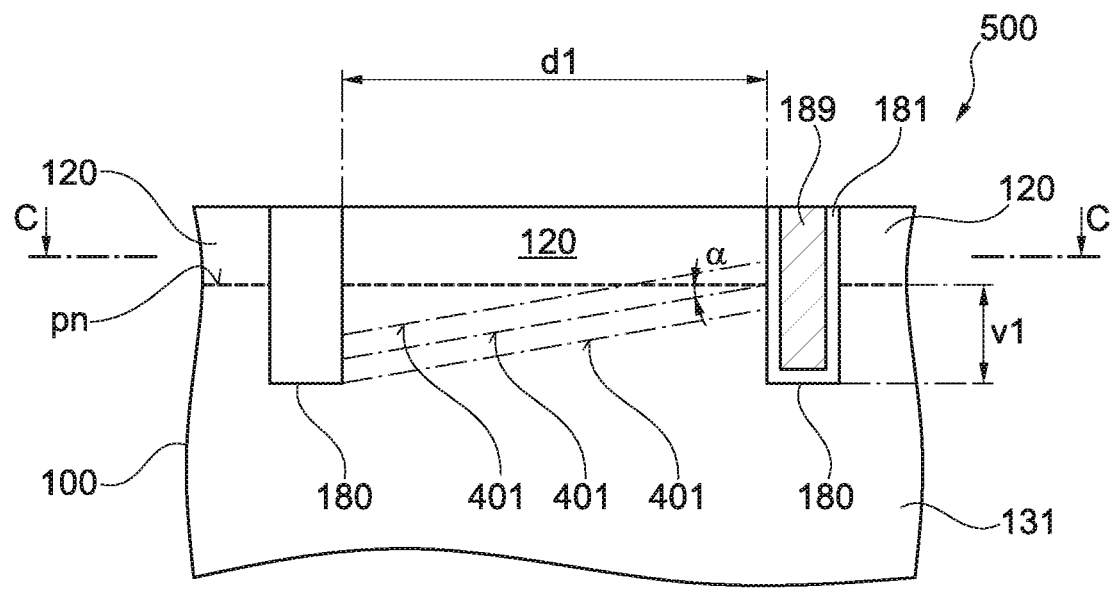
FIGS. 2A-2B show schematic vertical cross sections through semiconductor components in accordance with embodiments with barrier structures at a pn junction and at a unipolar junction.
Figure 2B:
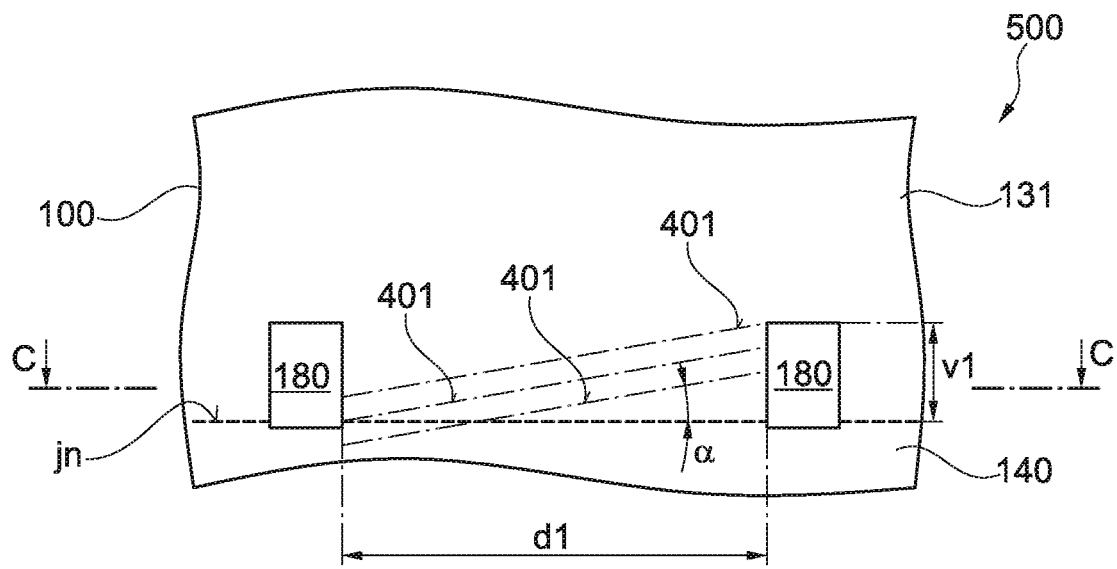

FIGS. 2A-2B relate to a semiconductor component 500, which can be a MOSFET or a semiconductor diode. The surfaces 101, 102 on the front side and rear side of the SiC semiconductor body 100 are generally tilted relative to the crystal lattice system of the SiC semiconductor body in order to obtain a high quality of the epitaxially deposited layer. The drift zone 131 is formed parallel to the first and second surfaces 101, 102. Principal lattice planes therefore intersect the junction pn, jn at an angle $\alpha$ of between 2° and 8°, e.g. approximately 4°. Crystal defects accordingly grow at a shallow angle with respect to the junction pn, jn from the junction pn, jn into the drift zone 131.

The barrier structures 180 form a physical barrier against crystal defect growth. The ratio v1:d1 can be greater than tan α and less than 3×tan α. All principal lattice planes 401 which intersect the junction pn, jn between two barrier structures 180 and also such principal lattice planes 401 which come close to the junction pn, jn end at one of the barrier structures 180.

The barrier structures 180 can consist of amorphized and/or polycrystalline silicon carbide or comprise amorphized and/or polycrystalline silicon carbide. In this case, the silicon carbide of the barrier structures 180 can be undoped or doped. By way of example, at least that part of a barrier structure 180 which extends into the drift zone 131 can be doped with the dopants of the drift zone 131. The barrier structures 180 can comprise impurity atoms, e.g. argon atoms, as a result of the implantation of which the barrier structures 180 are at least partly amorphized.

In accordance with another embodiment, a barrier structure can comprise a layer composed of thermal silicon oxide, composed of deposited silicon oxide, composed of a dielectric material having a relative permittivity of greater than 4, for example silicon nitride, composed of silicon oxynitride and/or composed of a glass or can consist of one or more of such layers. By way of example, the barrier structure 180 can predominantly consist of silicon nitride.

In the right-hand part of FIG. 2A, the barrier structure 180 comprises a conductive filling 189 and an insulating layer 181, which insulates the conductive filling from the SiC semiconductor body 100. The conductive filling 189 can be unconnected ("floating"), and is electrically insulated from gate electrodes of a MOSFET that are possibly present. The conductive filling 189 can be electrically insulated from load electrodes of the semiconductor component 500 or be electrically connected to one of the load electrodes.

The barrier structures 180 on the rear side of the SiC semiconductor body 100 as shown in FIG. 2B can have a lower dielectric strength than the barrier structures 180 on the front side of the SiC semiconductor body 100. The barrier structures 180 on the rear side of the SiC semiconductor body 100 are generally formed before epitaxial growth of a main part of the drift zone 131. In accordance with one embodiment, the barrier structures 180 can comprise or consist of amorphized and/or polycrystalline silicon carbide and can be produced for example by implantation of e.g. argon with a high dopant dose or by laser irradiation through the component rear side.

Figure 2C:
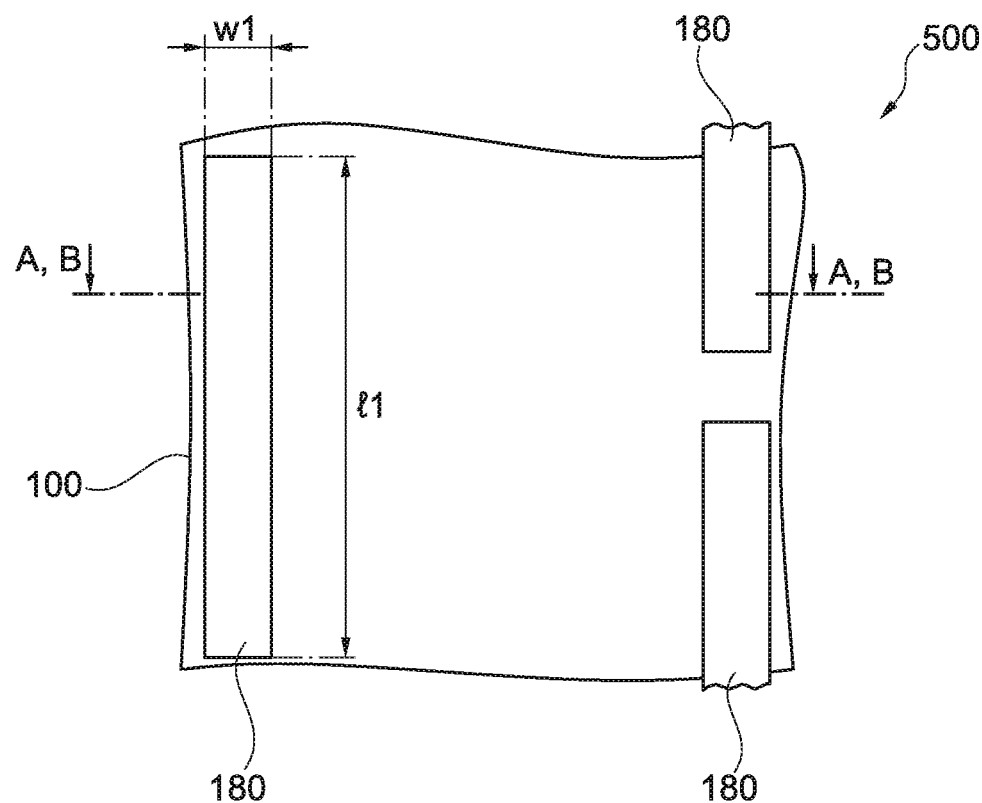
FIG. 2C shows a schematic horizontal cross section through the embodiments according to FIGS. 2A and 2B.

FIG. 2C shows barrier structures 180 having a transverse extent w1 and a longitudinal extent l1 perpendicular to the transverse extent w1, wherein the longitudinal extent l1 can be at least five times the transverse extent w1. The longitudinal extent l1 extends parallel or almost parallel to lines of intersection between the principal lattice planes 401 and the junction pn, jn.

The barrier structures 180 can extend in each case continuously or with interruptions from one side of an active region as far as an opposite side, wherein the interruptions between lines of adjacent barrier structures 180 can be offset relative to one another.

The active region of a semiconductor diode is determined by the lateral extent of an anode region. The active region of a MOSFET is determined by the lateral extent of a transistor cell array in which functional transistor cells TC are formed and are each connected to two load terminals.

Figure 3:
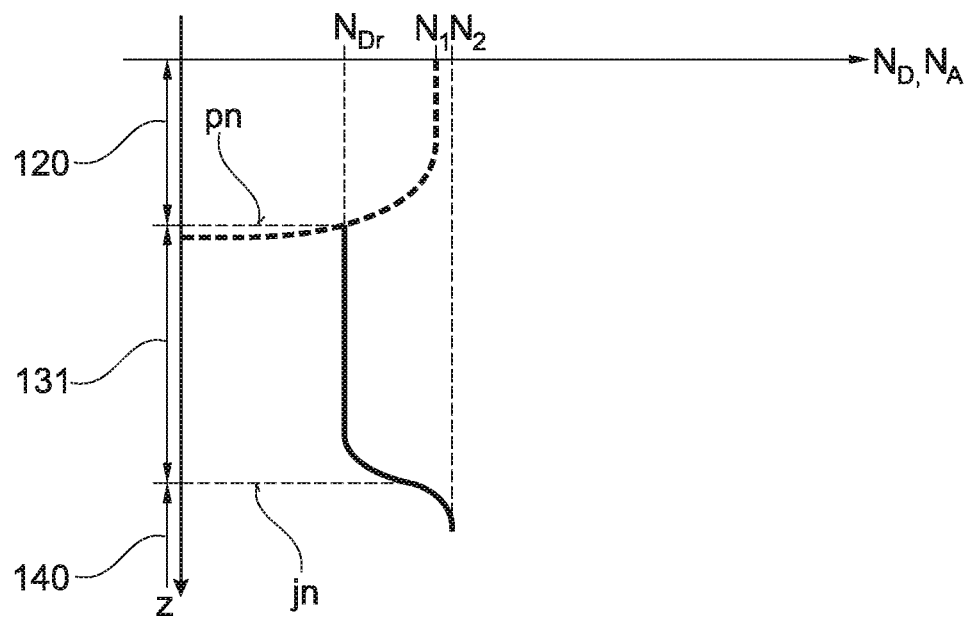
FIG. 3 shows a schematic diagram with vertical dopant concentration profiles in accordance with a further embodiment.

FIG. 3 shows a pn junction pn as an interface at which the dopings N1, $N_{Dr}$ of the doped region 120 of the second conductivity type and of the drift zone 131 of the first conductivity type precisely compensate for one another. A unipolar junction jn arises through the points at which a vertical dopant profile at the junction between the drift zone 131 having the doping $N_{Dr}$ and the doped region 140 of the first conductivity type and having the doping N2 has a point of inflection. In the figure, the doping N1, $N_{Dr}$ and N2 are shown as net dopant concentrations of the donor concentration $N_D$ and the acceptor concentration $N_A$ in the respective region.

In FIGS. 4A, 4B, 5, 6 and 7, the semiconductor component 500 is in each case a SiC MOSFET having a drift zone 131, having a semiconductor region 120, 140 and having transistor cells TC as described with reference to FIGS. 1A-1D, 2A-2C and 3, wherein the first load electrode 310 is connected to a source terminal S and the second load electrode 320 is connected to a drain terminal D.

Figure 4A:
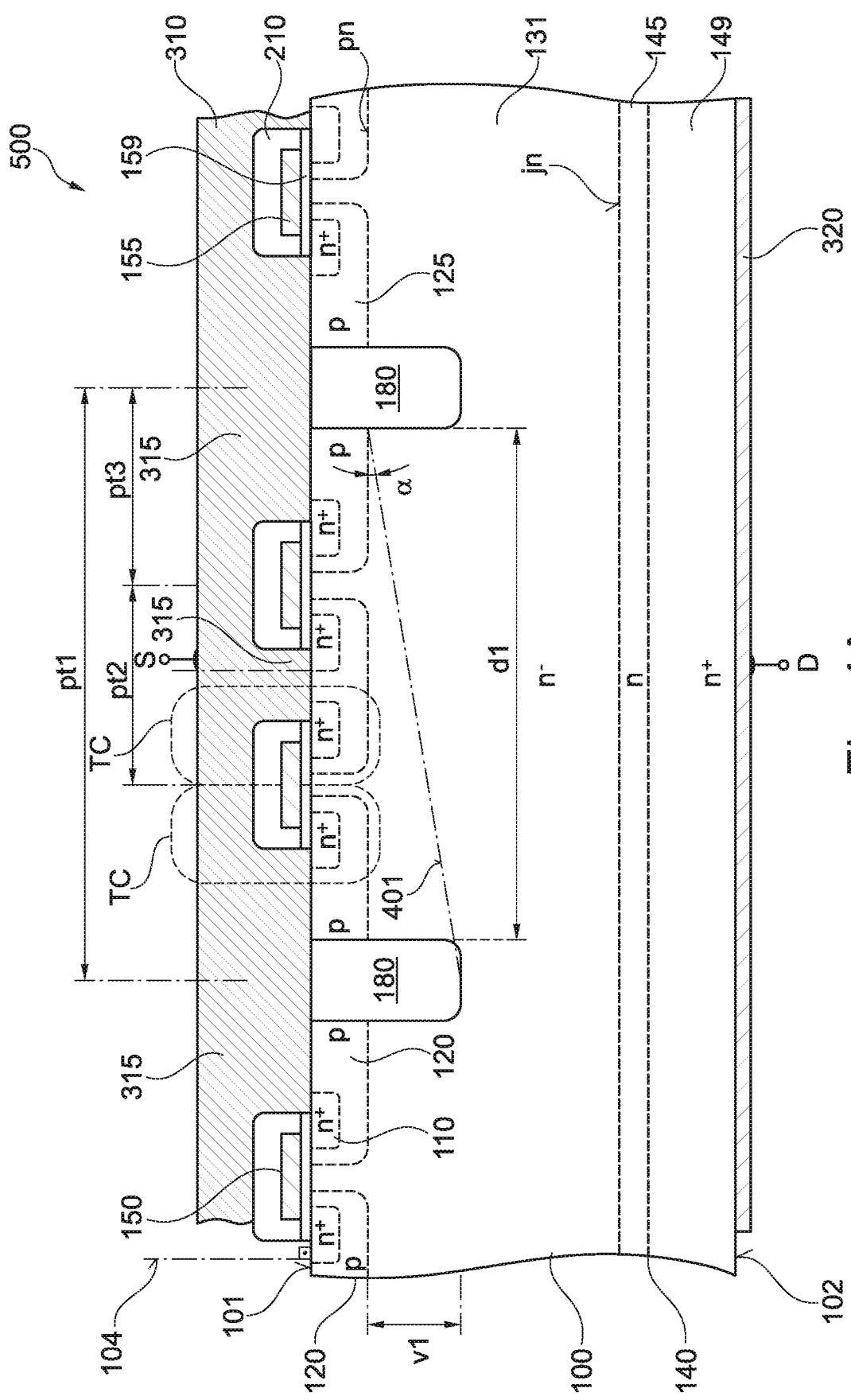
FIGS. 4A-4B show schematic vertical cross sections through SiC semiconductor components with barrier structures on a component front side and/or on a component rear side in accordance with embodiments with planar gate structures.
Figure 4B:
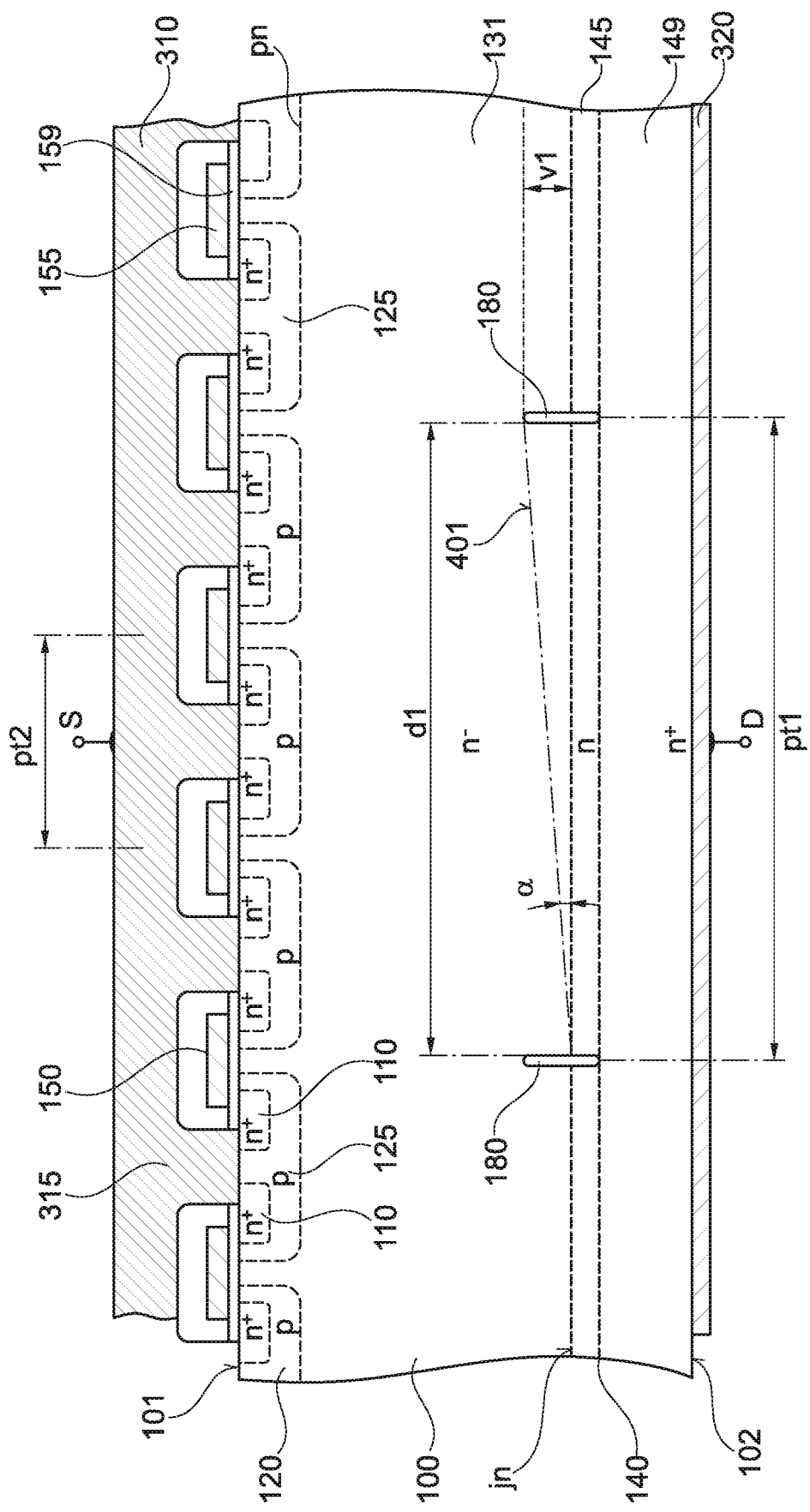

FIGS. 4A and 4B show semiconductor components 500 having planar gate structures 150 on the front side of a SiC semiconductor body 100, wherein an individual gate structure 150 can be assigned in each case to two transistor cells TC formed symmetrically with respect to the gate structure 150. The gate structures 150 each comprise a conductive gate electrode 155 and a gate dielectric 159, which can be formed directly on the first surface 101 and separates the gate electrode 155 from the SiC semiconductor body 100.

A semiconductor region 120, 140 can comprise a doped region 140 of a first conductivity type and a doped region 120 of a second conductivity type. The semiconductor region 120, 140 can form a junction pn, jn with the drift zone 131 in the SiC semiconductor body 100.

The doped region 120 of the second conductivity type can comprise body regions 125 extending from a first surface 101 into the SiC semiconductor body 100. In this case, a body region 125 can adjoin two adjacent gate structures 150 assigned to two transistor cells TC adjacent to one another. Source regions 110 of two transistor cells TC can be formed between the first surface 101 and the body region 125. The body region 125 can be electrically connected to the first load electrode 310 between two source regions 110. By way of example, a highly doped section of the body region 125 can adjoin the first surface 101 between the source regions 110. The drift zone 131 or more highly doped current distribution regions of the conductivity type of the drift zone 131 can adjoin the first surface 101 between adjacent body regions 125. Besides the body regions 125, the doped region 120 of the second conductivity type can comprise further regions of the second conductivity type. The doped region 120 of the second conductivity type forms a pn junction pn, with a drift zone 131.

The semiconductor region 120, 140 can comprise a doped region 140 of the first conductivity type between the drift zone 131 and the second surface 102 of the SiC semiconductor body 100, which doped region can form a unipolar junction jn with the drift zone 131. The doped region 140 of the first conductivity type can comprise a highly doped base region 149 adjoining the second load electrode 320. A partial layer 145 having a dopant concentration that is higher than in the drift zone 131 and lower than in the highly doped base region 149 can be formed between the highly doped base region 149 and the drift zone 131. A junction pn, jn between the semiconductor region 120, 140 and the drift zone 131 can comprise the pn junction pn, the unipolar junction jn or both.

An interlayer dielectric 210 can separate the gate electrode 155 from the first load electrode 310 on the front side of the SiC semiconductor body 100. The interlayer dielectric 210 can comprise for example a layer composed of thermal silicon oxide, composed of deposited silicon oxide, silicon nitride, silicon oxynitride and/or composed of a glass. Contacts 315 in openings of the interlayer dielectric 210 can connect the first load electrode 310 to the body regions 125 and the source regions 110.

In the on state, the transistor cells TC, in channel regions of the body regions 125, form lateral inversion channels along the first surface 101 between the source regions 110 and the sections of the drift zone 131 that adjoin the first surface 101.

The barrier structures 180 extend from the semiconductor region 120, 140 into the drift zone 131, wherein a vertical extent v1 of the barrier structures 180 in the drift zone 131 and a lateral distance d1 between adjacent barrier structures 180 can be chosen according to the aspects described above. A first center-to-center distance pt1 between adjacent barrier structures 180 can be an integer multiple of a second center-to-center distance pt2 between adjacent gate structures 150. By way of example, a third center-to-center distance pt3 between a barrier structure 180 and the adjacent gate structure 150 can be equal to the second center-to-center distance pt2.

FIG. 4A shows barrier structures 180 which extend from the doped region 120 of the second conductivity type into the drift zone 131. In the exemplary embodiment illustrated, the barrier structures 180 can extend from the first surface 101 into the SiC semiconductor body 100. It is also possible for the barrier structures 180 to be at a distance from the first surface 101.

FIG. 4B shows barrier structures 180 which extend from the doped region 140 of the first conductivity type into the drift zone 131. In the exemplary embodiment illustrated, the barrier structures 180 are at a distance from the second surface 102. It is also possible for the barrier structures 180 to extend from the second surface 102 into the SiC semiconductor body 100. The barrier structures 180 in accordance with FIG. 4B can be formed in addition to the barrier structures in accordance with FIG. 4A.

Figure 5:
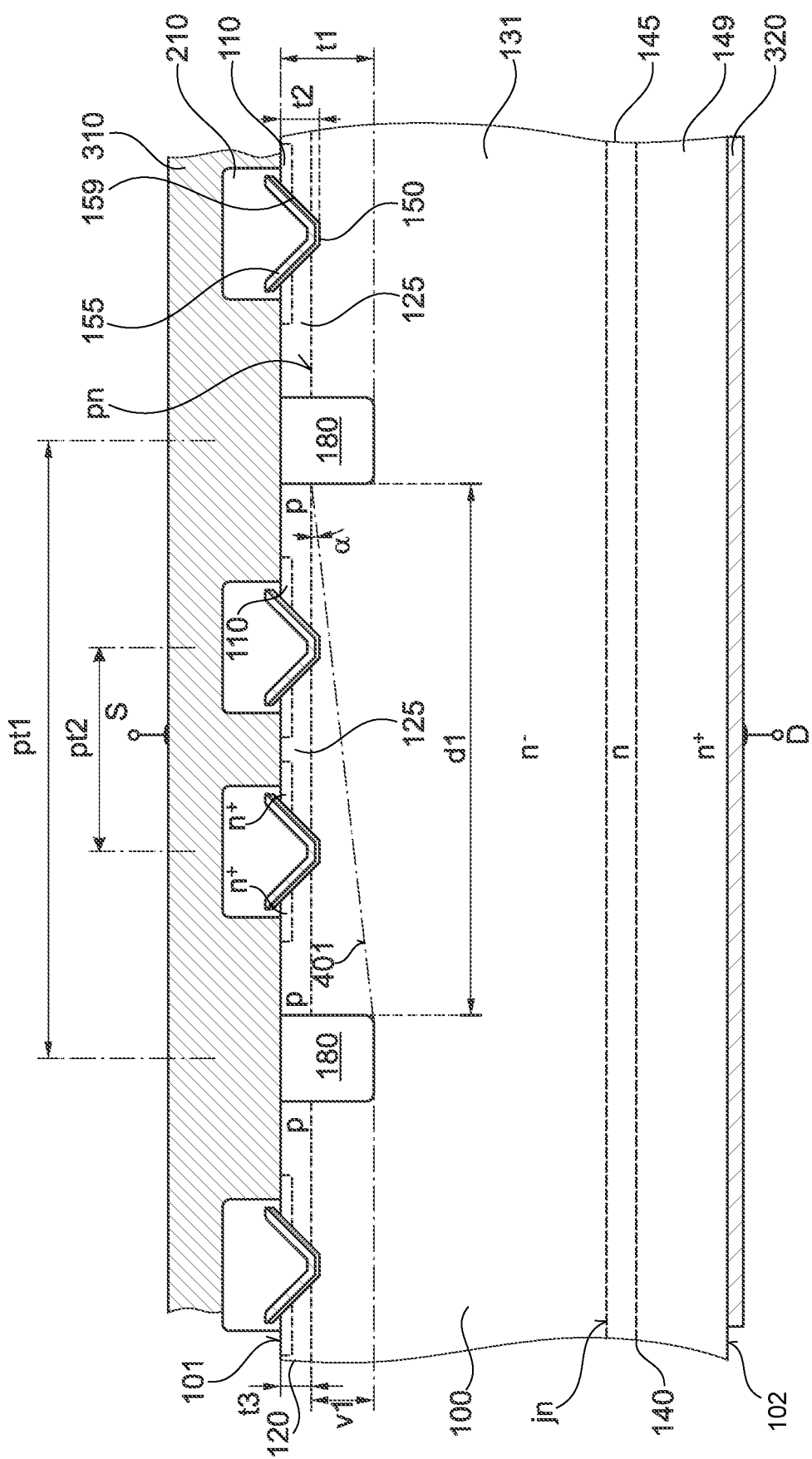
FIG. 5 shows a schematic vertical cross section through a SiC semiconductor component with barrier structures on a component front side in accordance with one embodiment with gate structures having a V-shaped vertical cross-sectional area.

In FIG. 5, the gate structures 150 are formed in trenches having a V-shaped vertical cross-sectional area. The gate electrode 155 can extend in each case with an approximately uniform layer thickness along the sidewalls and the bottom of the trenches. In mesas of the SiC semiconductor body 100 between adjacent gate structures 150, source regions 110 can be formed along the first surface 101. Body regions 125 can be formed between the source regions 110 and the drift zone 131. The body regions 125 can form partial regions of a semiconductor region 120, 140.

A first distance t1 between a lower edge of the barrier structures 180 and the first surface 101 can be greater than a second distance t2 between a lower edge of the gate structures 150 and the first surface 101. The first distance t1 between a lower edge of the barrier structures 180 and the first surface 101 can be greater than a third distance t3 between the first surface 101 and a pn junction pn which is formed between the first surface 101 and the drift zone 131 and which is at the furthest distance from the first surface 101.

Figure 6:
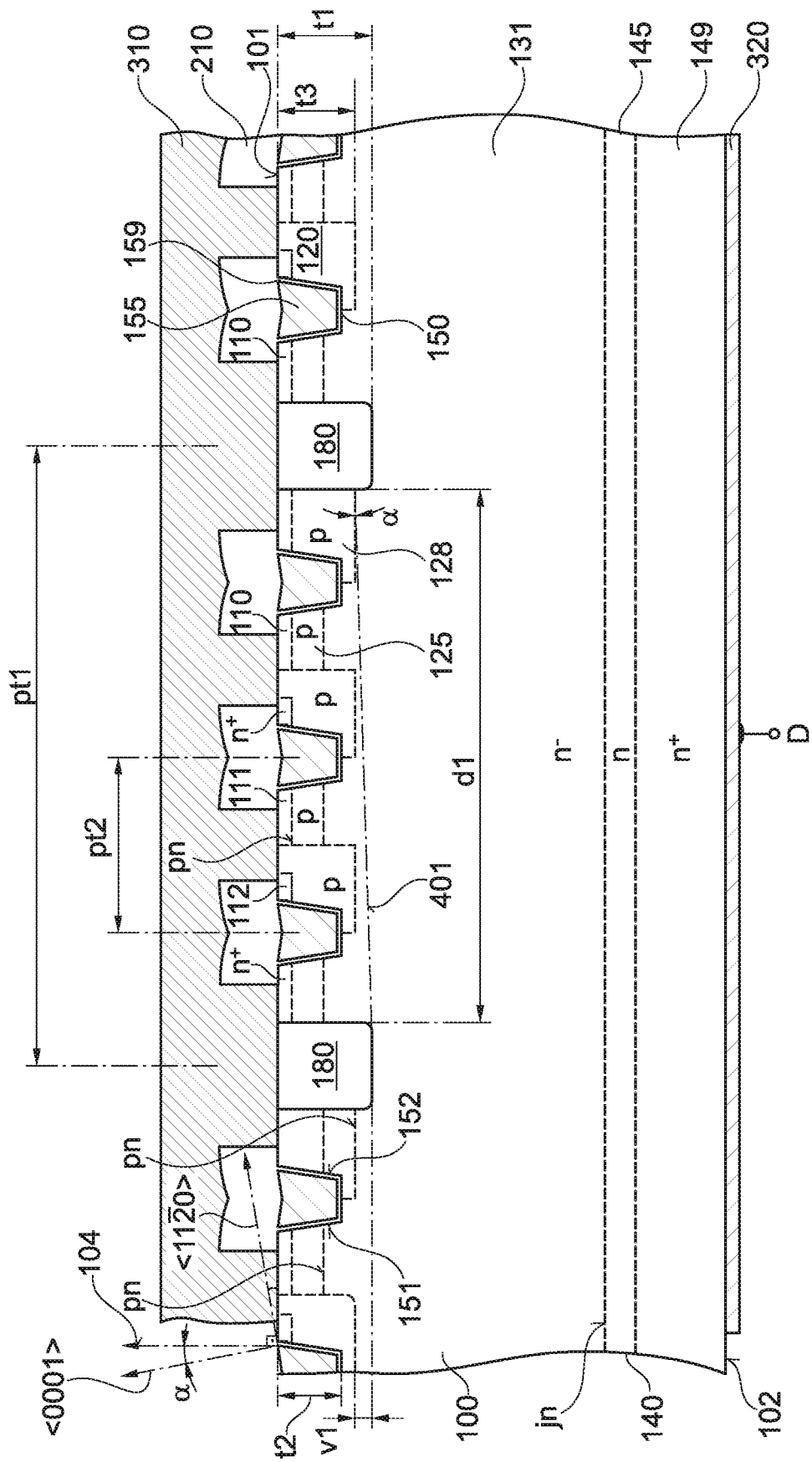
FIG. 6 shows a schematic vertical cross section through a SiC semiconductor component with barrier structures on a component front side in accordance with one embodiment with transistor cells with an inversion channel on one side.
Figure 7:
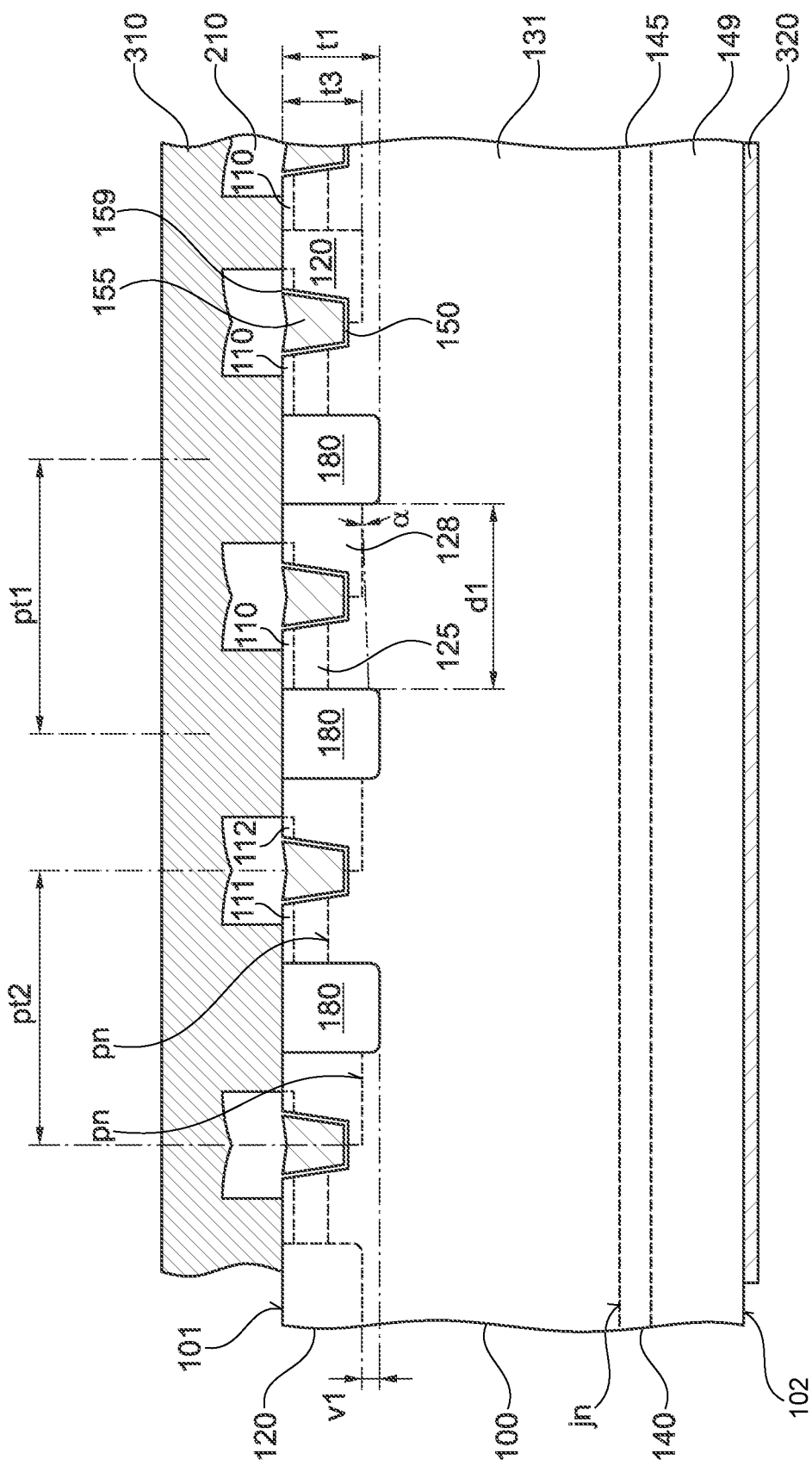
FIG. 7 shows a schematic vertical cross section through a SiC semiconductor component in accordance with one embodiment with barrier structures which differ from the gate structures structurally and/or in the absence of an electrical connection.

In FIGS. 6 and 7, the semiconductor component 500 is based on a SiC semiconductor body 100 comprising a silicon carbide crystal of the 4H polytype. The <0001>lattice direction can be tilted by an angle α of between 2° and 8° relative to the normal 104. The <11-20>lattice direction is tilted by the angle α relative to the first surface 101 and extends parallel to the cross-sectional plane. The <1-100>lattice direction extends orthogonally to the cross-sectional plane and orthogonally to the first surface 101.

First sidewalls 151 of gate structures 150 extend parallel to (11-20) lattice planes with high charge carrier mobility and/or deviate from an orientation of the (11-20) lattice planes by a maximum of 2°. Second sidewalls 152 situated opposite the first sidewalls 151 can deviate from the orientation of the (11-20) lattice planes by double the angle α and/or deviate from the orientation of the (11-20) lattice planes by a maximum of 2° from double the angle α.

Source regions 110 and body regions 125 adjoin the first sidewalls 151 of the gate structure 150. Shielding regions 128 can be formed along the second sidewalls. The shielding regions 128 can be more highly doped than the body regions 125 and can be connected to the first load electrode 310. The shielding regions 128 can separate the body regions 125 from second sidewalls 152. A vertical extent of the shielding regions 128 can be greater than a vertical extent of the body regions 125 at greater than a vertical extent of the gate structures 150 in the SiC semiconductor body 100. The doped region 120 of the second conductivity type can comprise both the body regions 125 and the shielding regions 128. The shielding regions 128 form the pn junction pn which is at the furthest distance from the first surface 101 and which forms the starting point for measuring a vertical extent v1 of the barrier structures 180 into the drift zone 131.

In the semiconductor component 500 in FIG. 6, a first center-to-center distance pt1 between adjacent barrier structures 180 is greater than a second center-to-center distance pt2 between adjacent gate structures 150.

Along the first sidewalls 151 of the gate structures 150, the source regions 110 can in each case be directly adjacent to the gate structure 150 and be formed exclusively between the body region 125 and the first surface 101. In accordance with the embodiment illustrated, besides first sections 111 along the first sidewalls 151, the source regions 110 comprise one or more second sections 112 which adjoin the second sidewalls 152 of the gate structures 150 and are respectively formed between shielding region 128 and first surface 101. The second sections 112, in the semiconductor body 100, can for example be separated from the first sections 111 by the shielding regions 128 and/or the body regions 125 or be connected to the first sections 111 via further sections of the same conductivity type.

In the semiconductor component 500 in FIG. 7, the first center-to-center distance pt1 between adjacent barrier structures can be equal to the second center-to-center distance pt2 between adjacent gate structures 150. The barrier structures 180 differ structurally from the gate structures 150. By way of example, the barrier structures 180 comprise no conductive structures or only such conductive structures which are electrically insulated from the gate electrode 155. By way of example, the barrier structures 180 comprise a conductive structure which is connected to the first load electrode 310 or is connected to none of the load electrodes 310, 320. By way of example, a conductive structure in the barrier structures 180 can be electrically unconnected.

In FIGS. 8A to 8D, 9A and 9B, the semiconductor component is in each case a semiconductor diode 510 having a SiC semiconductor body, a drift zone 131, a semiconductor region 120, 140 and barrier structures 180 as described with reference to FIGS. 1A-1D, 2A-2C and 3, wherein the first load electrode 310 forms an anode terminal A or is connected to an anode terminal A and the second load electrode 320 forms a cathode terminal K or is connected to a cathode terminal K.

The semiconductor region 120, 140 can comprise a doped region 120 of the second conductivity type and a doped region 140 of the first conductivity type. The doped region 120 of the second conductivity type can comprise an anode region 123, which can directly adjoin the first surface 101 of the SiC semiconductor body 100 and the first load electrode 310 and can form a pn junction pn with the drift zone 131. The doped region 140 of the first conductivity type can directly adjoin the second surface 102 of the SiC semiconductor body 100 and the second load electrode 310 and can form a unipolar junction jn with the drift zone 131. The doped region 140 of the first conductivity type has a higher dopant concentration than the drift zone 131. Barrier structures 180 extend from the semiconductor region 120, 140 into the drift zone 131.

Figure 8A:
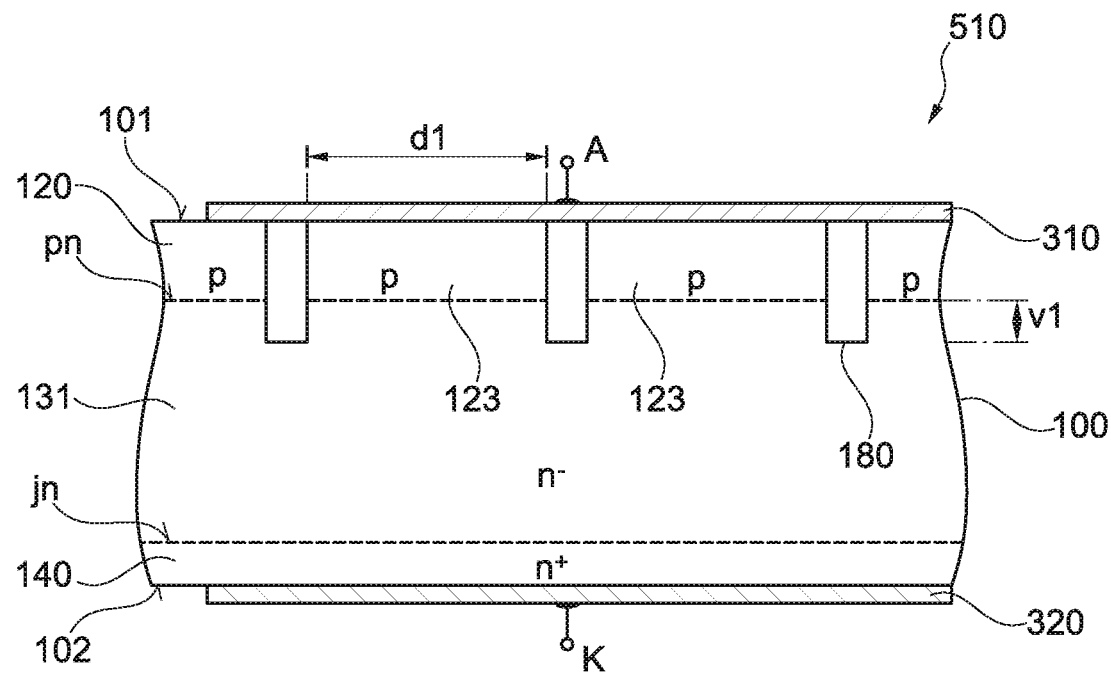
FIGS. 8A-8D show schematic vertical cross sections through semiconductor diodes with barrier structures in accordance with other embodiments.

In FIG. 8A, the barrier structures 180 extend from the semiconductor region 120 of the second conductivity type into the drift zone 131.

Figure 8B:
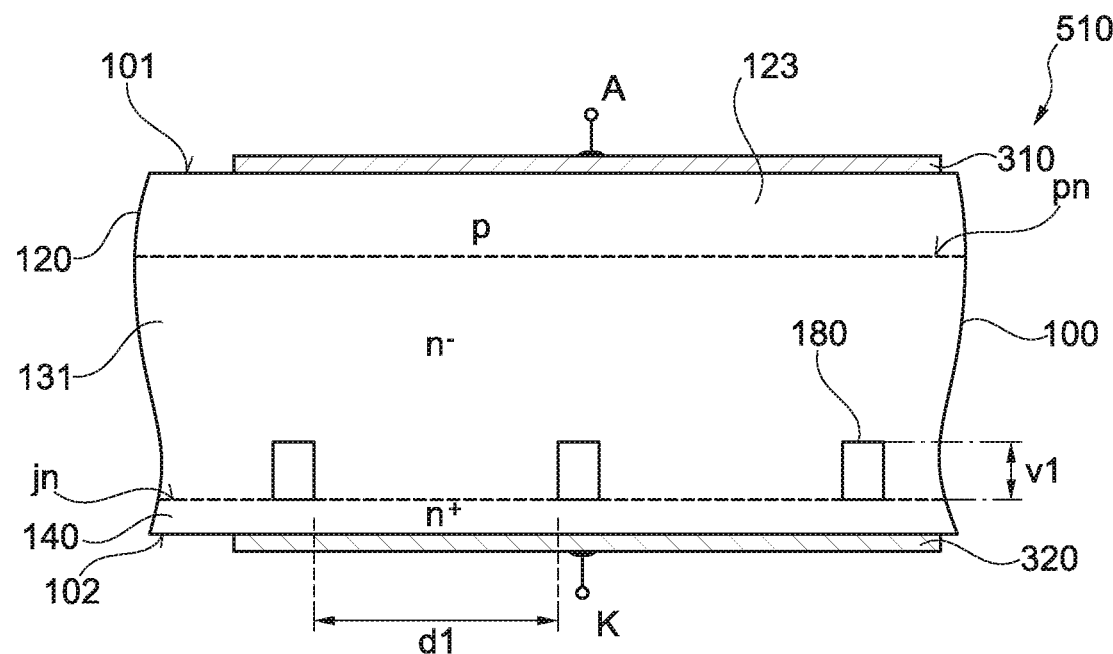

In FIG. 8B, the barrier structures 180 extend from the doped region 140 of the first conductivity type into the drift zone 131.

Figure 8C:
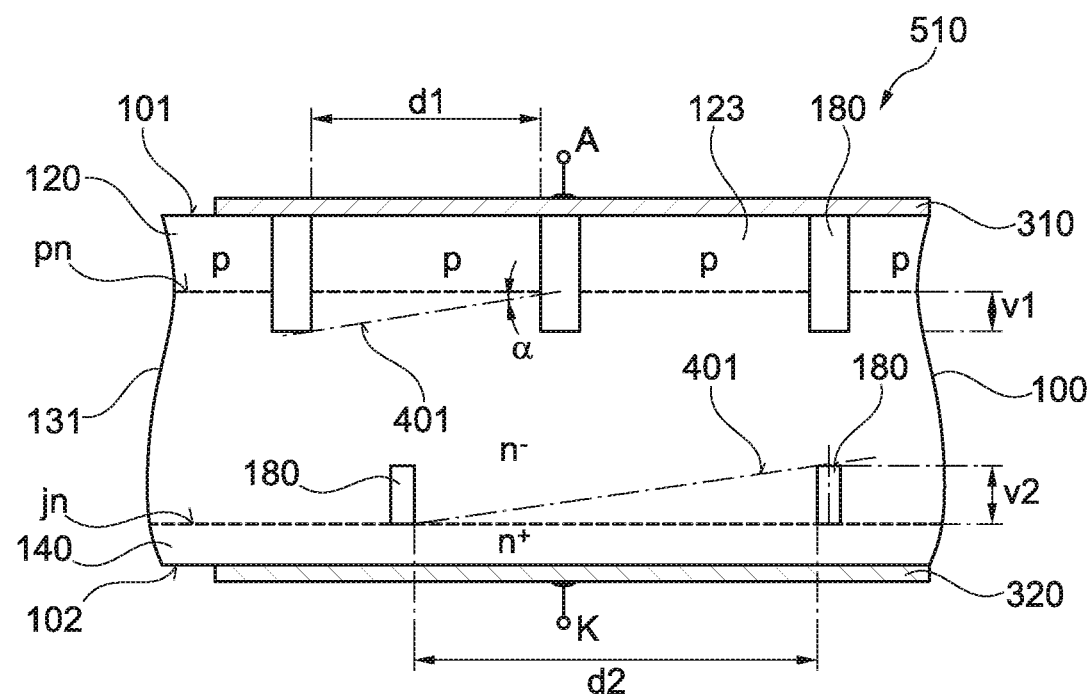

In accordance with FIG. 8C, barrier structures 180 can extend both from the doped region 120 of the second conductivity type and from the doped region 140 of the first conductivity type and thus both from the pn junction pn and from the unipolar junction jn into the drift zone 131.

The barrier structures 180 on the cathode side can have the same vertical extent in the drift zone 131 and be at the same lateral distance from one another as the barrier structures 180 on the anode side. In accordance with one embodiment, a vertical extent v2 of barrier structures 180 on the cathode side and the distance d2 between barrier structures 180 on the cathode side can deviate from the corresponding values v1, d1 on the anode side.

The lateral distance d2 between adjacent barrier structures 180 on the cathode side and a vertical extent v2 of the barrier structures 180 on the cathode side in the drift zone 131 can likewise be dimensioned such that all principal lattice planes 401 of the SiC semiconductor body 100 which intersect a unipolar junction jn formed between the drift zone 131 and the doped region 140 of the first conductivity type in the region between two barrier structures 180 at an angle α≤10° adjoin one of the barrier structures 180 in the drift zone 131.

Figure 8D:
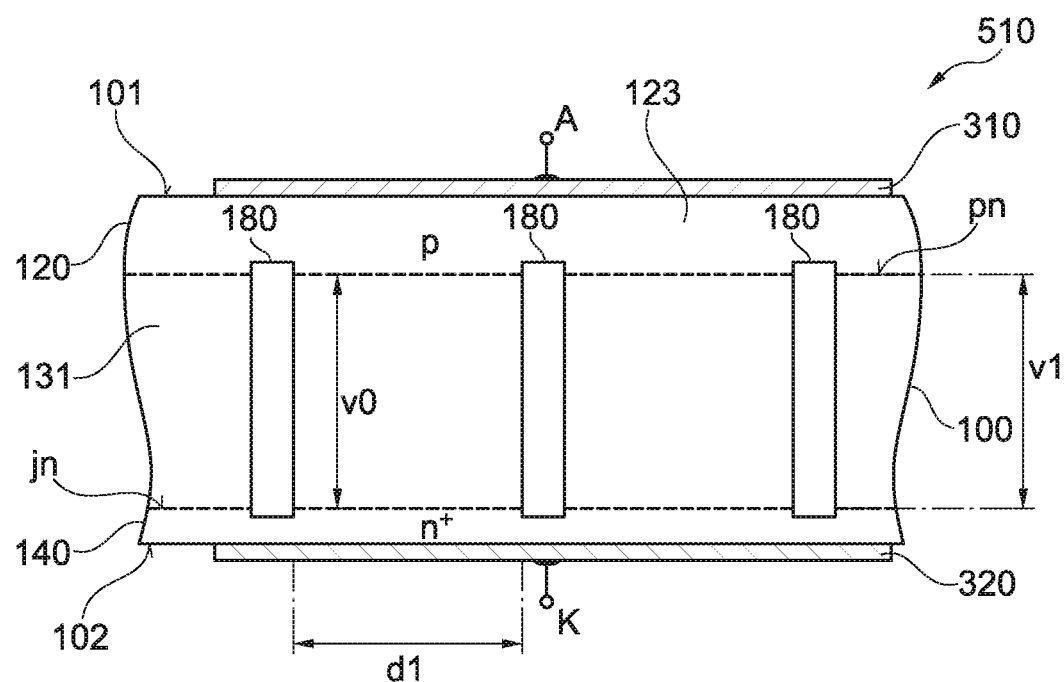

FIG. 8D shows an embodiment in which the barrier structures 180 extend through the drift zone 131 and a vertical extent v1 of the barrier structures 180 in the drift zone 131 is at least equal to a vertical extent v0 of the drift zone 131.

Figure 9A:
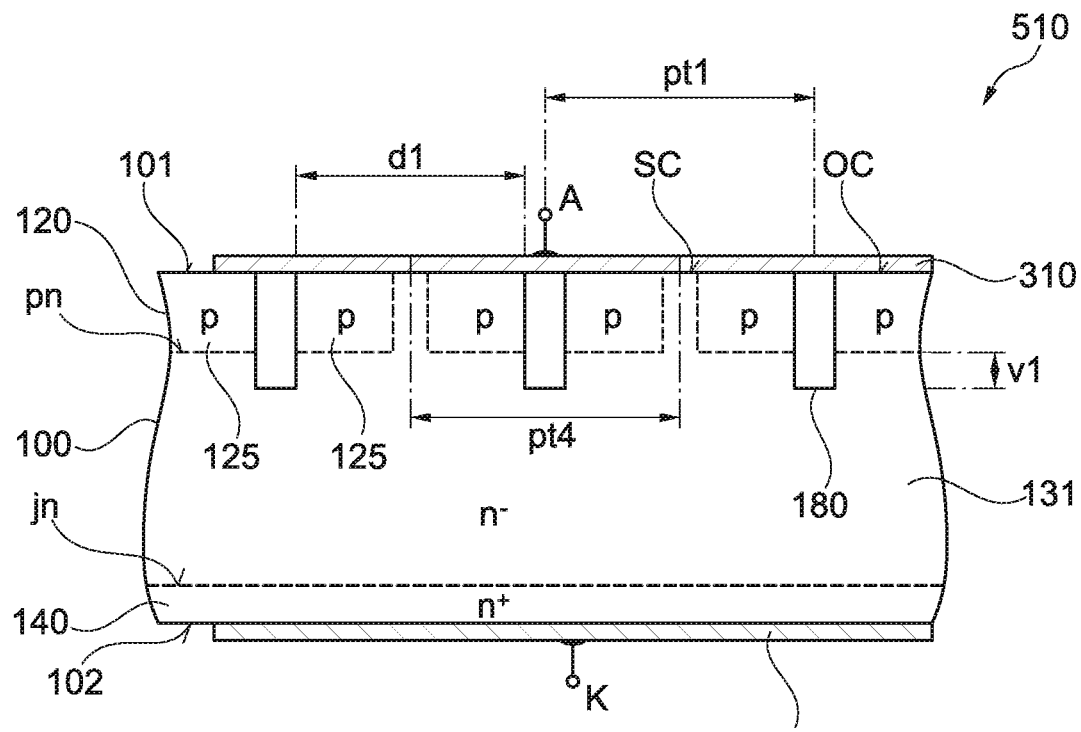
FIGS. 9A-9B show schematic vertical cross sections through semiconductor diodes with barrier structures in accordance with embodiments with an MPS (merged pin-Schottky) diode structure.
Figure 9B:
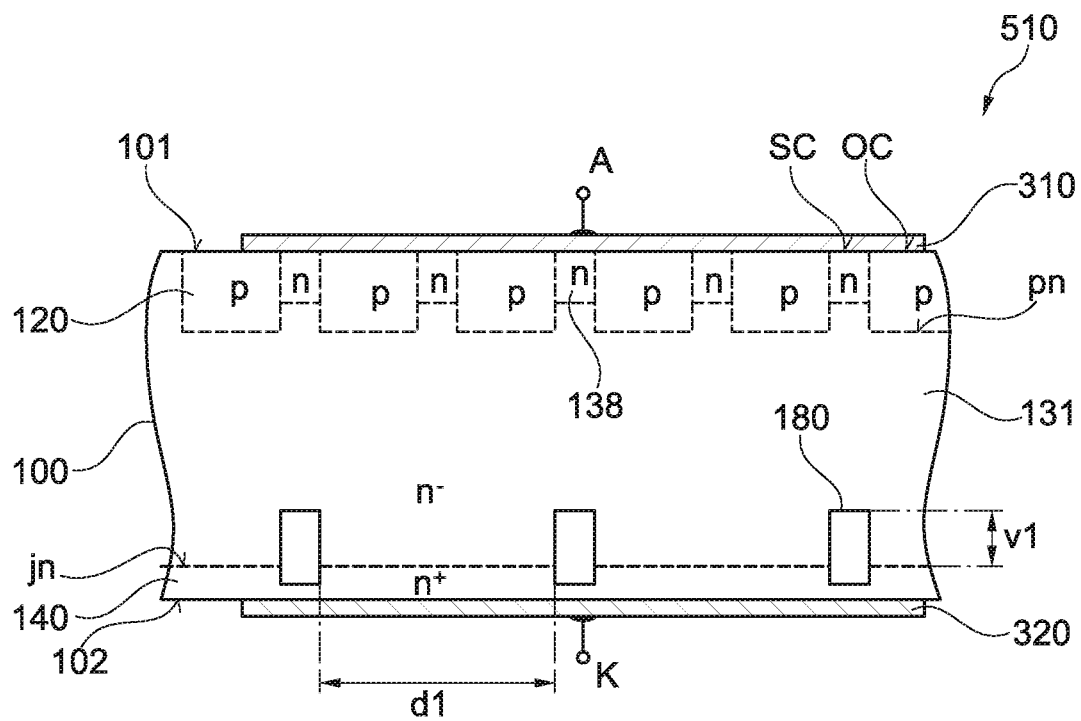

In accordance with the exemplary embodiments in FIGS. 9A and 9B, the first load electrode 310 forms both ohmic contacts OC with a doped region 120 of the second conductivity type and Schottky contacts SC with sections of the drift zone 131 or with contact regions 138 of the conductivity type of the drift zone 131, wherein the contact regions 138 can have a higher dopant concentration than the drift zone 131. The forward current ($I_F$) of the semiconductor diodes 510 flows via the Schottky contacts SC for low forward voltages. As the current intensity increases, the voltage drop across the Schottky contacts SC rises until the threshold voltage of the diode formed by the pn junctions pn is reached and the forward current flows increasingly via the ohmic contacts OC and the pn junction pn. In the off state, the doped regions 120 of the second conductivity type shield the Schottky contacts SC against the cathode potential and reduce the leakage current through the Schottky contacts SC.

The semiconductor diodes 510 comprise barrier structures 180 as described above. A first center-to-center distance pt1 between adjacent barrier structures 180 can be independent of a fourth center-to-center distance pt4 between adjacent Schottky contacts SC. In accordance with other exemplary embodiments, the first center-to-center distance pt1 can be an integer multiple of the fourth center-to-center distance pt4, or the fourth center-to-center distance pt4 can be an integer multiple of the first center-to-center distance pt1.

Further exemplary embodiments of a semiconductor component described here and of a semiconductor diode described here are described below.

In accordance with at least one embodiment, the semiconductor component comprises a SiC semiconductor body, in which a drift zone of a first conductivity type and a semiconductor region are formed. Furthermore, the semiconductor component comprises gate structures and barrier structures extending from the semiconductor region into the drift zone, wherein the barrier structures differ from the gate structures.

In accordance with at least one embodiment of the semiconductor component, the gate structures extend from a first surface of the SiC semiconductor body into the SiC semiconductor body. A region of a second conductivity type is formed between the drift zone and the first surface. The semiconductor region comprises the region of the second conductivity type. A first distance between a lower edge of the barrier structures and the first surface is greater than a second distance between a lower edge of the gate structures and the first surface.

In accordance with at least one embodiment of the semiconductor component, a first distance between a lower edge of the barrier structures and the first surface is greater than a third distance between the first surface and a pn junction which is formed between the first surface and the drift zone and which is at the furthest distance from the first surface.

In accordance with at least one embodiment of the semiconductor component, a region of the first conductivity type and having a higher doping than the drift zone is formed in the SiC semiconductor body. The semiconductor region comprises the region of the first conductivity type and the barrier structures extend at least in part from the region of the first conductivity type into the drift zone. In accordance with at least one embodiment of the semiconductor component, the region of the first conductivity type adjoins the drift zone on an opposite side of the drift zone relative to the gate structures. In accordance with at least one embodiment of the semiconductor component, the semiconductor region has at least one pn junction with the drift zone. In accordance with at least one embodiment of the semiconductor component, the semiconductor region has at least one unipolar junction with the drift zone.

In accordance with at least one embodiment of the semiconductor component, a lateral distance between adjacent barrier structures and a vertical extent of the barrier structures in the drift zone are dimensioned such that at least 90% of principal lattice planes of the SiC semiconductor body which intersect a junction formed between the drift zone and the semiconductor region in the region between two barrier structures at an angle of a maximum of 10° adjoin one of the barrier structures in the drift zone. In accordance with at least one embodiment of the semiconductor component, a polytype of the SiC semiconductor body is a 4H-SiC polytype and the principal lattice planes are (0001) lattice planes which intersect the junction at an angle of at least 2° and at most 8°.

In accordance with at least one embodiment of the semiconductor component, the barrier structures have a transverse extent and a longitudinal extent perpendicular to the transverse extent, said longitudinal extent being at least five times the transverse extent, wherein the longitudinal extent extends parallel to lines of intersection between the principal lattice planes and the junction.

In accordance with at least one embodiment of the semiconductor component, the gate structures extend from a first surface of the SiC semiconductor body into the SiC semiconductor body. A region of a second conductivity type is formed between the drift zone and the first surface. The semiconductor component additionally comprises a source region of the conductivity type of the drift zone, wherein the source region is formed between the first surface and the drift zone and forms a transistor pn junction with the region of the second conductivity type.

In accordance with at least one embodiment of the semiconductor component, the semiconductor component comprises a body region of the second conductivity type, wherein a dopant concentration in the body region has at most 50% of a dopant concentration in the region of the second conductivity type and the body region is at a greater distance from a second surface of the SiC semiconductor body, said second surface being situated opposite the first surface than the region of the second conductivity type. In accordance with at least one embodiment of the semiconductor component, a bulk breakdown strength of the barrier structures can be at least 90% of the bulk breakdown strength of a part of the drift zone that is adjacent to the barrier structures. The barrier structures can comprise polycrystalline silicon carbide, amorphous silicon carbide, crystalline silicon carbide of a different crystal type, having a different crystal orientation, and/or crystalline silicon carbide of a different polytype than the drift zone. A first center-to-center distance between the barrier structures can be greater than a second center-to-center distance between the gate structures.

In accordance with at least one embodiment of the semiconductor diode, the semiconductor diode comprises a SiC semiconductor body, in which a drift zone of a first conductivity type and a semiconductor region are formed. Furthermore, the semiconductor diode comprises barrier structures extending from the semiconductor region into the drift zone.

In accordance with at least one embodiment of the semiconductor diode, principal lattice planes of the SiC semiconductor body which intersect a junction between the drift zone and the semiconductor region end at the barrier structures.

In accordance with at least one embodiment of the semiconductor diode, a lateral distance between adjacent barrier structures and a vertical extent of the barrier structures, said vertical extent being relative to a junction formed between the semiconductor region and the drift zone, are dimensioned such that at least 90% of the principal lattice planes which intersect the junction in the region between two barrier structures at an angle of less than 10° adjoin one of the barrier structures in the drift zone. In accordance with at least one embodiment, all principal lattice planes which intersect the junction in the region between two barrier structures at an angle of at most 10° adjoin one of the barrier structures in the drift zone.

In accordance with at least one embodiment of the semiconductor diode, the semiconductor region comprises a doped region of a second conductivity type, and the doped region of the second conductivity type is formed between a first surface of the SiC semiconductor body and the drift zone.

In accordance with at least one embodiment of the semiconductor diode, the semiconductor region comprises a doped region of the first conductivity type, and the doped region of the first conductivity type is formed between a second surface of the SiC semiconductor body and the drift zone.

In accordance with at least one embodiment of the semiconductor diode, the semiconductor diode comprises a first load electrode, which forms an ohmic contact with the region of the second conductivity type and a Schottky contact with the drift zone or with a contact region of the conductivity type of the drift zone.

In accordance with at least one embodiment of the semiconductor diode, the barrier structures have a transverse extent and a longitudinal extent perpendicular to the transverse extent, said longitudinal extent being at least five times the transverse extent, wherein the longitudinal extent extends parallel to lines of intersection between the principal lattice planes and the unipolar junction.

The invention described here is not restricted to the exemplary embodiments by the description on the basis of said exemplary embodiments. Rather, the invention encompasses any novel feature and the combination of features, which in particular includes any combination of features in the patent claims, even if this feature or this combination itself is not explicitly specified in the patent claims or exemplary embodiments.

This application is intended to cover any adaptations or variations of the specific embodiments discussed herein. Therefore, it is intended that this invention be limited only by the claims and the equivalents thereof.

What is claimed is:

1. A semiconductor component, comprising:
    a SiC semiconductor body comprising a first surface, a second surface opposite from the first surface, a drift zone of a first conductivity type;
    gate structures; and
    barrier structures that are laterally spaced apart from one another, the barrier structures differing from the gate structures,
    wherein the gate structures are disposed at the first surface of the SiC semiconductor body,
    wherein a first center-to-center distance between the barrier structures is greater than a second center-to-center distance between the gate structures,
    wherein either:
        at least two of the barrier structures extend across a pn junction between the drift zone and a region of a second conductivity type that is disposed between the drift zone and the first surface, or
        at least two of the barrier structures extend across a unipolar junction between the drift zone and a region of the first conductivity type that is disposed between the drift zone and the second surface, the region of the first conductivity type being more highly doped than the drift zone, and
    wherein immediately adjacent ones of the barrier structures are laterally spaced apart from one another such that at least 90% of principal lattice planes of the SiC semiconductor body adjoin one of the barrier structures in the drift zone and the pn junction or unipolar junction to which the one of the barrier structures extends across.

2. The semiconductor component of claim 1, wherein the gate structures extend from the first surface of the SiC semiconductor body into the SiC semiconductor body, wherein a first distance between a lower edge of the barrier structures and the first surface is greater than a second distance between a lower edge of the gate structures and the first surface.

3. The semiconductor component of claim 2, further comprising:
a body region of the second conductivity type,
wherein a dopant concentration in the body region has at most 50% of a dopant concentration in the region of the second conductivity type,
wherein at least two of the barrier structures extend across the pn junction between the drift zone and the region of the second conductivity type, and
wherein the body region is at a greater distance from the second surface of the SiC semiconductor body than the region of the second conductivity type.

4. The semiconductor component of claim 1, wherein at least two of the barrier structures extend across the pn junction between the drift zone and the region of the second conductivity type, and wherein the semiconductor component further comprises:
a source region of the conductivity type of the drift zone and formed between the first surface and the drift zone, the source region forming a transistor pn junction with the region of the second conductivity type.

5. The semiconductor component of claim 1, wherein a polytype of the SiC semiconductor body is a 4H-SiC polytype, and wherein the principal lattice planes are (0001) lattice planes which intersect the pn junction or the unipolar junction to which the one of the barrier structures extends across at an angle of at least 2° and at most 8°.

6. The semiconductor component of claim 5, wherein the barrier structures have a transverse extent and a longitudinal extent perpendicular to the transverse extent, the longitudinal extent being at least five times the transverse extent, wherein the longitudinal extent extends parallel to lines of intersection between the principal lattice planes and the and the pn junction or the unipolar junction to which the one of the barrier structures extends across.

7. The semiconductor component of claim 1, wherein a bulk breakdown strength of the barrier structures is at least 90% of a bulk breakdown strength of a part of the drift zone that is adjacent to the barrier structures.

8. The semiconductor component of claim 1, wherein the barrier structures comprise polycrystalline silicon carbide, amorphous silicon carbide, crystalline silicon carbide of a different crystal type, having a different crystal orientation, and/or crystalline silicon carbide of a different polytype than the drift zone.

9. The semiconductor component of claim 1, wherein at least two of the gate structures are laterally disposed between immediately adjacent ones of the barrier structures.

10. The semiconductor component of claim 1, wherein at least two of the barrier structures extend across the pn junction between the drift zone and the region of the second conductivity type, and wherein at least two of the barrier structures extend across the pn junction between the drift zone and the region of the second conductivity type that is disposed between the drift zone and the first surface.

11. The semiconductor component of claim 1, wherein at least two of the barrier structures extend across the unipolar junction between the drift zone and the region of the first conductivity type that is disposed between the drift zone and the second surface, and wherein at least two of the barrier structures extend across the unipolar junction between the drift zone and the region of the first conductivity type that is disposed between the drift zone and the second surface.

12. The semiconductor component of claim 1, wherein at least two of the barrier structures extend across the pn junction between the drift zone and the region of the second conductivity type that is disposed between the drift zone and the first surface, and at least another two of the barrier structures extend across the unipolar junction between the drift zone and the region of the first conductivity type that is disposed between the drift zone and the second surface, wherein bottoms of the at least two of the barrier structures that extend across the pn junction terminate in the drift zone, and wherein bottoms of the at least two of the barrier structures that extend across the unipolar junction terminate in the drift zone.

* * * * *

UNITED STATES PATENT AND TRADEMARK OFFICE
CERTIFICATE OF CORRECTION

PATENT NO. : 11,063,144 B2  
APPLICATION NO. : 16/361696  
DATED : July 13, 2021  
INVENTOR(S) : Rupp et al.

Page 1 of 1

It is certified that error appears in the above-identified patent and that said Letters Patent is hereby corrected as shown below:

In the Claims

Column 19, Lines 33, 34 (Claim 6, Lines 6, 7) please change "and the and the pn" to -- and the pn --

Signed and Sealed this  
Seventh Day of December, 2021

Drew Hirshfeld  
*Performing the Functions and Duties of the*  
*Under Secretary of Commerce for Intellectual Property and*  
*Director of the United States Patent and Trademark Office*